US010090220B2

(12) United States Patent
Ikoshi et al.

(10) Patent No.: US 10,090,220 B2
(45) Date of Patent: Oct. 2, 2018

(54) SEMICONDUCTOR DEVICE

(71) Applicant: Panasonic Intellectual Property Management Co., Ltd., Osaka (JP)

(72) Inventors: Ayanori Ikoshi, Kyoto (JP); Masahiro Hikita, Toyama (JP); Keiichi Matsunaga, Toyama (JP); Takahiro Sato, Toyama (JP); Manabu Yanagihara, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/427,629

(22) Filed: Feb. 8, 2017

(65) Prior Publication Data
US 2017/0148701 A1    May 25, 2017

Related U.S. Application Data

(63) Continuation of application No. PCT/JP2015/003837, filed on Jul. 30, 2015.

(30) Foreign Application Priority Data

Aug. 11, 2014 (JP) .................................. 2014-163977

(51) Int. Cl.
*H01L 23/31* (2006.01)
*H01L 23/29* (2006.01)
(Continued)

(52) U.S. Cl.
CPC ........ *H01L 23/3171* (2013.01); *H01L 23/291* (2013.01); *H01L 23/3192* (2013.01);
(Continued)

(58) Field of Classification Search
None
See application file for complete search history.

(56) References Cited

U.S. PATENT DOCUMENTS 7,993,983 B1 *  8/2011  Lin ..................... H01L 21/6835
                                                        438/106
2003/0034550 A1  2/2003  Nakatani
(Continued)

FOREIGN PATENT DOCUMENTS

JP    S62-214633 A    9/1987
JP    S62-269332 A    11/1987
(Continued)

OTHER PUBLICATIONS

Extended European Search Report issued in Application No. 15832294.1 dated Jul. 21, 2017.
International Search Report issued in Application No. PCT/JP2015/003837 dated Sep. 8, 2015, with english translation.

*Primary Examiner* — Michelle Mandala
(74) *Attorney, Agent, or Firm* — McDermott Will & Emery LLP

(57) ABSTRACT

A semiconductor device includes a substrate; a semiconductor layer; a first protective film; a first adhesive layer disposed on the first protective film; an electrode pad disposed on the first protective film; a second protective film disposed to cover and be in contact with the electrode pad and the first adhesive layer; and a first opening formed in part of the second protective film such that the upper surface of the electrode pad is exposed, wherein in a plan view, the first adhesive layer includes a first projection projecting from the electrode pad radially in a direction of the periphery of the electrode pad and continuously surrounding the periphery of the electrode pad; and the second protective film is continuously to cover and contact part of the upper and side surfaces of the electrode pad, the upper and side surfaces of first projection, and the first protective film.

15 Claims, 18 Drawing Sheets

(51) Int. Cl.
*H01L 23/00* (2006.01)
*H01L 23/528* (2006.01)
*H01L 29/06* (2006.01)
*H01L 29/417* (2006.01)

(52) U.S. Cl.
CPC .......... *H01L 23/528* (2013.01); *H01L 23/564* (2013.01); *H01L 24/05* (2013.01); *H01L 29/0684* (2013.01); *H01L 29/417* (2013.01); H01L 2224/04042 (2013.01); H01L 2224/05014 (2013.01); H01L 2224/05023 (2013.01); H01L 2224/05144 (2013.01); H01L 2224/05166 (2013.01); H01L 2224/05169 (2013.01); H01L 2224/05181 (2013.01); H01L 2224/48463 (2013.01); H01L 2924/01022 (2013.01); H01L 2924/01073 (2013.01); H01L 2924/04941 (2013.01); H01L 2924/04953 (2013.01); H01L 2924/05042 (2013.01); H01L 2924/1033 (2013.01); H01L 2924/1304 (2013.01)

(56) References Cited

U.S. PATENT DOCUMENTS

| | | | |
|---|---|---|---|
| 2005/0104220 A1* | 5/2005 | Tsuchiya | H01L 24/10 257/774 |
| 2008/0230908 A1 | 9/2008 | Igarashi | |
| 2010/0164103 A1 | 7/2010 | Hishida et al. | |
| 2010/0164112 A1 | 7/2010 | Hishida et al. | |

FOREIGN PATENT DOCUMENTS

| | | |
|---|---|---|
| JP | H02-014526 A | 1/1990 |
| JP | 2003-037110 A | 2/2003 |
| JP | 2008-235728 A | 10/2008 |
| JP | 2010-153707 A | 7/2010 |
| JP | 2010-153708 A | 7/2010 |
| JP | 4597653 B2 | 12/2010 |

* cited by examiner

SEMICONDUCTOR DEVICE

CROSS REFERENCE TO RELATED APPLICATIONS

This application is a U.S. continuation application of PCT International Patent Application Number PCT/JP2015/003837 filed on Jul. 30, 2015, claiming the benefit of priority of Japanese Patent Application Number 2014-163977 filed on Aug. 11, 2014, the entire contents of which are hereby incorporated by reference.

BACKGROUND

1. Technical Field

The present disclosure relates to semiconductor devices, and particularly relates to power transistors used in inverters, power conditioners, and power supply circuits.

2. Description of the Related Art

Recently, field effect transistors (FET) including gallium nitride (GaN) semiconductors as high-frequency high-power devices have been actively developed. GaN can form a variety of mixed crystals with aluminum nitride (AlN) and indium nitride (InN).

In particular, in hetero junctions of nitride semiconductors, a high concentration of two-dimensional electron gas (2DEG) is generated at the junction interface by spontaneous polarization or piezoelectric polarization without doping. Field effect transistors and Shottky barrier diodes (SBDs) including such 2DEG-rich layers as carriers have been receiving attention as high-frequency and high-power devices.

This novel material GaN has many problems related to its reliability, particularly low moisture resistance. As a method of improving moisture resistance, a technique of disposing a metallic layer including one of Ti, Ta, and Pt over openings formed in a protective film disposed over electrode pads to block a path of water invasion is disclosed (see Japanese Unexamined Patent Application Publication No. 2010-15370).

SUMMARY

Unfortunately, the technique disclosed in Unexamined Patent Application Publication No. 2010-153707 does not always have a sufficient effect to prevent the invasion of water, and is susceptible to improvement in prevention of moisture resistance.

This disclosure has been made to solve these problems. An object of this disclosure is to provide a semiconductor device which enables prevention of invasion of water into electrode pads and wiring layers to ensure high moisture resistance of power transistors.

To achieve the above object, a semiconductor device according to one aspect of this disclosure includes: a substrate; a semiconductor layer disposed on the substrate; a first protective film disposed on the semiconductor layer; a first adhesive layer disposed on the first protective film, and including at least one metal material selected from Ti, TiN, Ta, and TaN or a laminate including a combination of Ti, TIN, Ta, and TaN; an electrode pad disposed on the first protective film and in contact with side surfaces and part of an upper surface of the first adhesive layer; a second protective film disposed to cover and be in contact with the electrode pad and the first adhesive layer; and a first opening formed in part of the second protective film such that an upper surface of the electrode pad is exposed, wherein in a plan view, the first adhesive layer includes a first projection projecting from the electrode pad radially in a direction of a periphery of the electrode pad and continuously surrounding the electrode pad, and the second protective film is continuously disposed to cover and be in contact with part of the upper surface and part of side surfaces of the electrode pad, an upper surface and side surfaces of the first projection, and the first protective film.

In such a configuration, the first adhesive layer is horizontally projected from the electrode pad, the upper surface and side surfaces of the projected first adhesive layer are in contact with the second protective film, and the lower surface of the projected first adhesive layer is in contact with the first protective film. For this reason, even if water invades from the interface between the electrode pad and the second protective film, water can be completely blocked at the interface between the first adhesive layer and the second protective film, ensuring high moisture resistance of the semiconductor device.

To achieve the above object, a semiconductor device according to one aspect of this disclosure includes: a substrate; a semiconductor layer disposed on the substrate; a first protective film disposed on the semiconductor layer; a first adhesive layer disposed on the first protective film, and including at least one metal material selected from Ti, TiN, Ta, and TaN or a laminate including a combination of Ti, TiN, Ta, and TaN; an electrode pad disposed on part of an upper surface of the first adhesive layer; a second protective film disposed to cover and be in contact with the electrode pad and the first adhesive layer; and a first opening formed in part of the second protective film such that an upper surface of the electrode pad is exposed, wherein in a plan view, the first adhesive layer includes a second projection projecting from the electrode pad radially in a direction of a periphery of the electrode pad, and the second protective film is continuously disposed to cover and be in contact with part of an upper surface and side surfaces of the electrode pad, an upper surface and side surfaces of the second projection, and the first protective film.

In such a configuration, the first adhesive layer is horizontally projected from the electrode pad, the upper surface and side surfaces of the projected first adhesive layer are in contact with the second protective film, and the lower surface of the projected first adhesive layer is in contact with the first protective film. For this reason, even if water invades from the interface between the electrode pad and the second protective film, water can be completely blocked at the interface between the first adhesive layer and the second protective film, ensuring high moisture resistance of the semiconductor device.

To achieve the above object, a semiconductor device according to one aspect of this disclosure includes: a substrate; a semiconductor layer disposed on the substrate; a first protective film disposed on the semiconductor layer; a first adhesive layer disposed on the first protective film, and including at least one metal material selected from Ti, TiN, Ta, and TaN or a laminate including a combination of Ti, TiN, Ta, and TaN; an electrode pad disposed away from the first adhesive layer at a predetermined interval; a second protective film disposed to cover and be in contact with the electrode pad and the first adhesive layer; a first opening formed in part of the second protective film such that an upper surface of the electrode pad is exposed, wherein in a plan view, the first adhesive layer is disposed away from the electrode pad at a predetermined interval, and continuously surrounds the electrode pad, and the second protective film is continuously disposed to cover and be in contact with part of an upper surface and side surfaces of the electrode pad, the first protective film, and an upper surface and side surfaces of the first adhesive layer.

In such a configuration, the first adhesive layer is disposed away from the electrode pad at an interval, and surrounds the electrode pad. The upper surface and side surfaces of the first adhesive layer are in contact with the second protective film, and the lower surface of the first adhesive layer is in contact with the first protective film. For this reason, even if water invades from the interface between the electrode pad and the second protective film, water can be completely blocked at the interface between the first adhesive layer and the second protective film, ensuring high moisture resistance of the semiconductor device.

A second adhesive layer may be disposed on the first adhesive layer.

In such a configuration, the adhesion between adhesive layer and its corresponding protective film can be enhanced according to the first protective film and the second protective film, preventing invasion of water.

In the transistor of the present disclosure, the first protective film below the first adhesive layer can be opened, and the lower surface of the first adhesive layer is in contact with the semiconductor layer.

Moreover, the first adhesive layer may penetrate through the first protective film from a side of the electrode pad disposed, and may be in contact with the semiconductor layer.

In such a configuration, the adhesion to the surface of the semiconductor layer surface can be enhanced, preventing invasion of water through the surface of the semiconductor layer.

The semiconductor device according to one aspect of this disclosure further includes: an ohmic electrode disposed on the semiconductor layer; the first protective film disposed to cover an upper surface and side surfaces of the ohmic electrode; a second opening formed in part of the first protective film such that the upper surface of the ohmic electrode is exposed; a third adhesive layer disposed in contact with side surfaces of the second opening and part of an upper surface of the first protective film and including at least one metal material selected from Ti, TiN, Ta, and TaN or a laminate including a combination of Ti, TiN, Ta, and TaN; a first finger wiring layer disposed on the third adhesive layer; and the second protective film disposed to cover and be in contact with the first finger wiring layer and the third adhesive layer, wherein in a plan view, the third adhesive layer includes a third projection projecting from the first finger wiring layer radially in a direction of a periphery of the first finger wiring layer, and is in contact with the first adhesive layer across the width of the first finger wiring layer, and the second protective film is continuously disposed to cover and be in contact with an upper surface and side surfaces of the first finger wiring layer, an upper surface and side surface of the third projection, and the first protective film.

In such a configuration, invasion of water from the electrode pad and the first finger wiring layer can be prevented in a transistor including a finger wiring layer.

Moreover, the semiconductor device according to one aspect of this disclosure may include: a second finger wiring layer in a lower portion of the first adhesive layer and a lower portion of the third adhesive layer, and wherein the first adhesive layer is disposed between the electrode pad and the second finger wiring layer, and the third adhesive layer is disposed between the first finger wiring layer and the second finger wiring layer.

In such a configuration, invasion of water to the first finger wiring layer can be prevented.

Moreover, the semiconductor device may further include: a first p-type layer disposed on the semiconductor layer so as to surround a portion immediately under side surfaces of the first adhesive layer; and a second p-type layer disposed on the semiconductor layer so as to surround a portion immediately under the third adhesive layer.

Moreover, the semiconductor device may further include: a first n-type layer disposed on the semiconductor layer so as to surround a portion immediately under side surfaces of the first adhesive layer; and a second n-type layer disposed on the semiconductor layer so as to surround a portion immediately under side surfaces of the third adhesive layer.

In such a configuration, concentration of the electric field to the semiconductor layer immediately under the first adhesive layer and the third adhesive layer can be relaxed during application of high voltage to the electrode pad, reducing the effect of invasion of water.

The present disclosure can provide a semiconductor device which enables prevention of invasion of water into electrode pads and wiring layers to ensure high moisture resistance of power transistors.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Knowledge Based on the Present Disclosure

The knowledge based on the present disclosure will be described before description of the embodiments according to the present disclosure.

As described above, a novel material GaN has many problems about reliability. The present inventors manufactured a traditional power transistor, and have found that the resulting power transistor had poor adhesion of electrode pads and wiring layers to a protective film which covers these components, resulting in low moisture resistance. As described above, specific methods for improving the moisture resistance are disclosed, such as the technique disclosed in Unexamined Patent Application Publication No. 2010-153707 of disposing a metallic layer including one of Ti, Ta, and Pt over openings of a protective film for covering electrode pads including Au to block a path of water invasion.

One of typical effective measures against low moisture resistance is an increase in adhesion between main metallic layers such as the electrode pads and the protective film which covers those metallic layers. An increase in adhesion between main metallic layers such as the electrode pads and the protective film which covers those metallic layers can prevent invasion of water into semiconductor devices, thus enhancing the moisture resistance of the semiconductor devices. The method disclosed in Unexamined Patent Application Publication No. 2010-153707, which discloses a technique aimed at an increase in moisture resistance of the semiconductor devices, also has problems.

Figure 15:
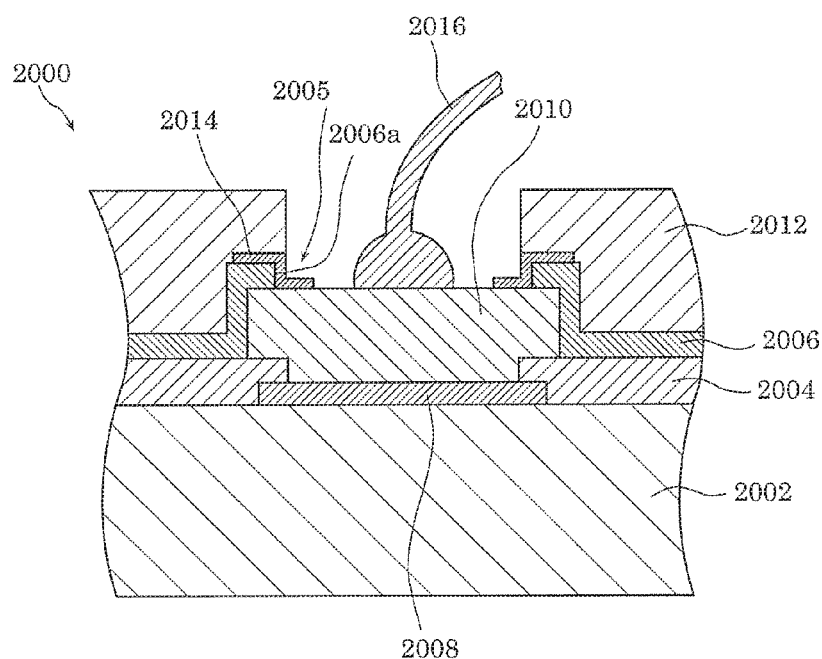
FIG. 15 is a schematic view illustrating the semiconductor device according to the related art.

FIG. 15 illustrates a structure of an electrode pad according to the related art. As illustrated in FIG. 15, semiconductor device 2000 includes electrode pad 2010 including Au, and silicon nitride film 2006 which covers electrode pad 2010. Silicon nitride film 2006 as a protective layer has opening 2005. Metallic layer 2014 including one of Ti, Ta, and Pt is disposed in contact with edges 2006a of opening 2005 of silicon nitride film 2006 such that electrode pad 2010 is exposed.

Unfortunately, prevention of water invasion and thus an enhancement. in moisture resistance of the semiconductor devise are difficult to achieve by using an adhesive layer including Ti, for example, (metallic layer 2014) in edges 2006a of the opening of protective film 2006 including SiN. It is believed that such difficulties in an enhancement in moisture resistance of the semiconductor devices are attributed to the following mechanism: The surface of electrode pad 2010 including Au has large irregularities of about 0.5 µm, for example, and Ti is affected by such large irregularities, resulting in poor adhesion between Au and Ti or between Ti and SiN.

Accordingly, the prevent inventors achieve a semiconductor device which enables prevention of water from invading to the electrode pad and the wiring layer, and can ensure a power transistor having high moisture resistance, as described below. Embodiments according to the present disclosure will now be described.

Embodiment 1

Embodiment 1 will be described with reference to the drawings. This disclosure will be described by way of the following embodiments and the attached drawings. The description is intended to be illustrative, and this disclosure is not intended to be limited to these embodiments and drawings. Numeral values, shapes, materials, components, arrangements, positions, and connection forms of the components, steps, order of the steps, and the like shown in the embodiments below are only examples, and will not limit the present invention. Among the components of the embodiments below, the components not described in an independent claim representing the most superordinate concept of the present invention will be described as arbitrary components. The dimensions and ratios of dimensions in the drawings are not always drawn to exact scale.

Figure 1:
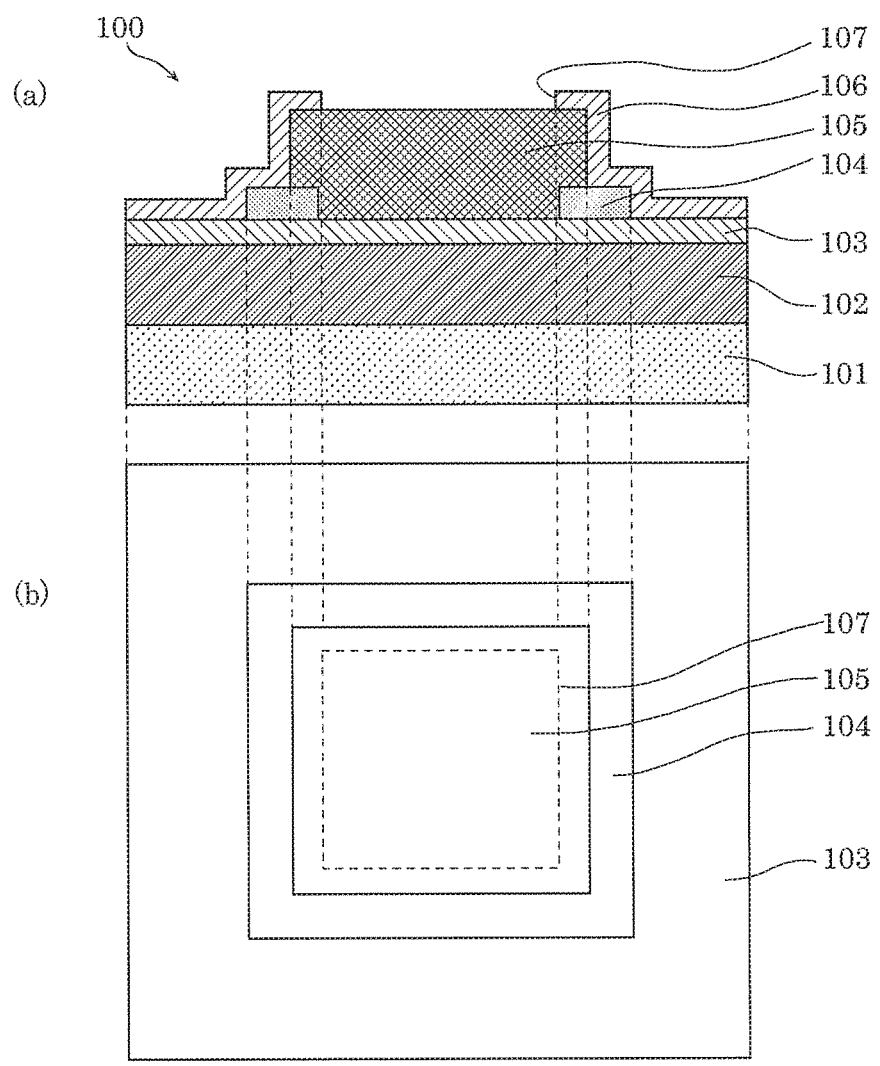
FIG. 1 is a schematic view illustrating a semiconductor device according to Embodiment 1.

FIG. 1 is a schematic view illustrating a semiconductor device according to the present embodiment; (a) is a sectional view, and (b) is a plan view. In (b) of FIG. 1, second protective film 106 is not illustrated.

As illustrated in (a) of FIG. 1, semiconductor device 100 includes substrate 101, semiconductor layer 102, first protective film 103, first adhesive layer 104, electrode pad 105, and second protective film 106.

Substrate 101 is formed of silicon. As illustrated in (a) of FIG. 1, substrate 101 includes semiconductor layer 102 having a structure including an AlGaN layer, a GaN layer, a buffer layer, and a silicon substrate. Semiconductor layer 102 includes a buffer layer including a superlattice disposed on substrate 101, a GaN layer having a thickness of about 2 µm, and an AlGaN layer having a thickness of about 50 nm sequentially disposed, for example. In this disclosure, the description will be made by way of GaN.

Semiconductor layer 102 includes first protective film 103 disposed thereon. First protective film 103 is formed of at least one of $SiO_2$, $Si_3N_4$, AlN, $Al_2O_3$, $Ga_2O_3$, MgO, $ZrO_2$, $HfO_2$, and $La_2O_3$. First protective film 103 is formed across the entire surface of semiconductor layer 102 by plasma CVD.

First protective film 103 includes first adhesive layer 104 disposed thereon. First adhesive layer 104 is formed of a single layer of Ti, TiN, Ta, or TaN or a laminate of a combination thereof. First adhesive layer 104 has a thickness of about 200 nm. As illustrated in (a) and (b) of FIG. 1, first adhesive layer 104 is formed into the form of a rectangular frame in a plan view.

Specifically, first adhesive layer 104 is disposed in a flat region having a surface roughness (RMS) of about 5 nm on first protective film 103. First adhesive layer 104 is deposited across the entire surface of first protective film 103 by sputtering, and is dry etched, for example, into a frame shape having a predetermined dimension in a plan view.

In the next step, electrode pad 105 including Au, Al, or Cu and having a thickness of about 5 μm is formed in contact with side surfaces of first adhesive layer 104 and part of the upper surface thereof by electrolysis plating.

Specifically, electrode pad 105 is disposed such that part of the upper surface and side surfaces of first adhesive layer 104 not contacting electrode pad 105 are horizontally projected from electrode pad 105 in a cross-sectional view.

In other words, electrode pad 105 is disposed to cover the inside, the edges of the inner periphery, and part of the upper surface of the frame of frame-shaped first adhesive layer 104. In a plan view, as illustrated in (b) of FIG. 1, first adhesive layer 104 is disposed such that the inner periphery of first adhesive layer 104 is covered with electrode pad 105 while the outer periphery of first adhesive layer 104 is projected from the outline of electrode pad 105 to surround the outer periphery of electrode pad 105. At this time, the horizontal projection of first adhesive layer 104 from electrode pad 105 can have a length of 1 to 2 μm, for example. First adhesive layer 104 is at least projected from electrode pad 105. First adhesive layer 104 can have a width of 5 to 10 μm.

After formation of electrode pad 105, second protective film 106 is formed over first protective film 103, first adhesive layer 104, and electrode pad 105 by plasma CVD, for example. Second protective film 106 is formed of at least one of $SiO_2$, $Si_3N_4$, AlN, $Al_2O_3$, $Ga_2O_3$, MgO, $ZrO_2$, $HfO_2$, and $La_2O_3$. In second protective film 106 on electrode pad 105, first opening 107 is formed excluding a portion of second protective film 106 disposed on the edges of electrode pad 105. First opening 107 is formed into a rectangular shape in a plan view by dry etching. As a result, electrode pad 105 is exposed from first opening 107 of second protective film 106.

The moisture resistance of such a semiconductor device described above is typically affected by the adhesion between electrode pad 105 and second protective film 106. Such a semiconductor device, however, has larger irregularities on the surface of electrode pad 105 formed by electrolysis plating, for example, and has very weak intrinsic adhesion between electrode pad 105 and second protective film 106. These characteristics may lead to invasion of water through the interface between electrode pad 105 and second protective film 106, and thus the semiconductor device does not always have sufficient moisture resistance.

In the present embodiment, first adhesive layer 104 having high surface flatness is disposed in a region of first protective film 103 having low surface roughness. This first adhesive layer 104 ensures higher adhesion between first adhesive layer 104 and electrode pad 105 and between first adhesive layer 104 and second protective film 106 than that between electrode pad 105 and second protective film 106.

In this configuration, second protective film 106 is continuously to cover first protective film 103, side surfaces of first adhesive layer 104 and the upper surface continuing the side surfaces of first adhesive layer 104, and side surfaces of electrode pad 105 and the upper surface continuing the side surfaces of electrode pad 105. Accordingly, if electrode pad 105 and second protective film 106 do not have sufficient adhesion to prevent invasion of water, invasion of water can be prevented at the interface between first protective film 103 and first adhesive layer 104 and the interface between first adhesive layer 104 and electrode pad 105, in which higher adhesion is ensured.

The mechanism to ensure high adhesion at the interface between second protective film 106 and first adhesive layer 104 will now be described. First, first adhesive layer 104 has a flat surface because first adhesive layer 104 is formed on first protective film 103 having a flat surface by sputtering. For this reason, second protective film 106 securely adheres to first adhesive layer 104 at the contact interface in a uniform manner, and the contact interface has no locally low adhesion. Furthermore, in first adhesive layer 104 including a single layer of Ti, TIN, Ta, or TaN or a laminate including a combination thereof, dangling bonds are present on the surface of first adhesive layer 104. The dangling bonds of first adhesive layer 104 and the dangling bonds of second protective film 106 are chemically bonded to increase the adhesion between these components.

The mechanism to ensure high adhesion at the interface between electrode pad 105 and first adhesive layer 104 will now be described. Since electrode pad 105 and first adhesive layer 104 are formed with metals, a solid phase reaction occurs in a low temperature, and metal atoms in electrode pad 105 and first adhesive layer 104 diffuse into each other. This diffusion enhances the adhesion between electrode pad 105 and first adhesive layer 104 to prevent invasion of water.

In the present embodiment, electrode pad 105 is formed of Au. Formation of electrode pad using Au by electrolysis plating produces surface irregularities larger than those using another metal such as Ti. Thus, water more readily invades through the interface between the surface of Au and the metal in contact with Au. Even if the surface of electrode pad 105 made of Au has small irregularities, the surface of electrode pad 105 barely has excess dangling bond to generate surface bonding between Au and another metal. For this reason, water more readily invades through the interface between the surface of Au and another metal in contact with Au. Also in the present embodiment, the surface of electrode pad 105 barely has excess dangling bond, and thus poor adhesion to second protective film 106. As a result, water invades from the interface between electrode pad 105 and second protective film 106. Even in electrode pad 105 including Au, however, invasion of water can be prevented due to high adhesion between first adhesive layer 104 and second protective film 106 and electrode pad 105.

In semiconductor device 100 according to the present embodiment, first adhesive layer 104 can prevent invasion of water through the interface between electrode pad 105 and second protective film 106.

Embodiment 2

Figure 2:
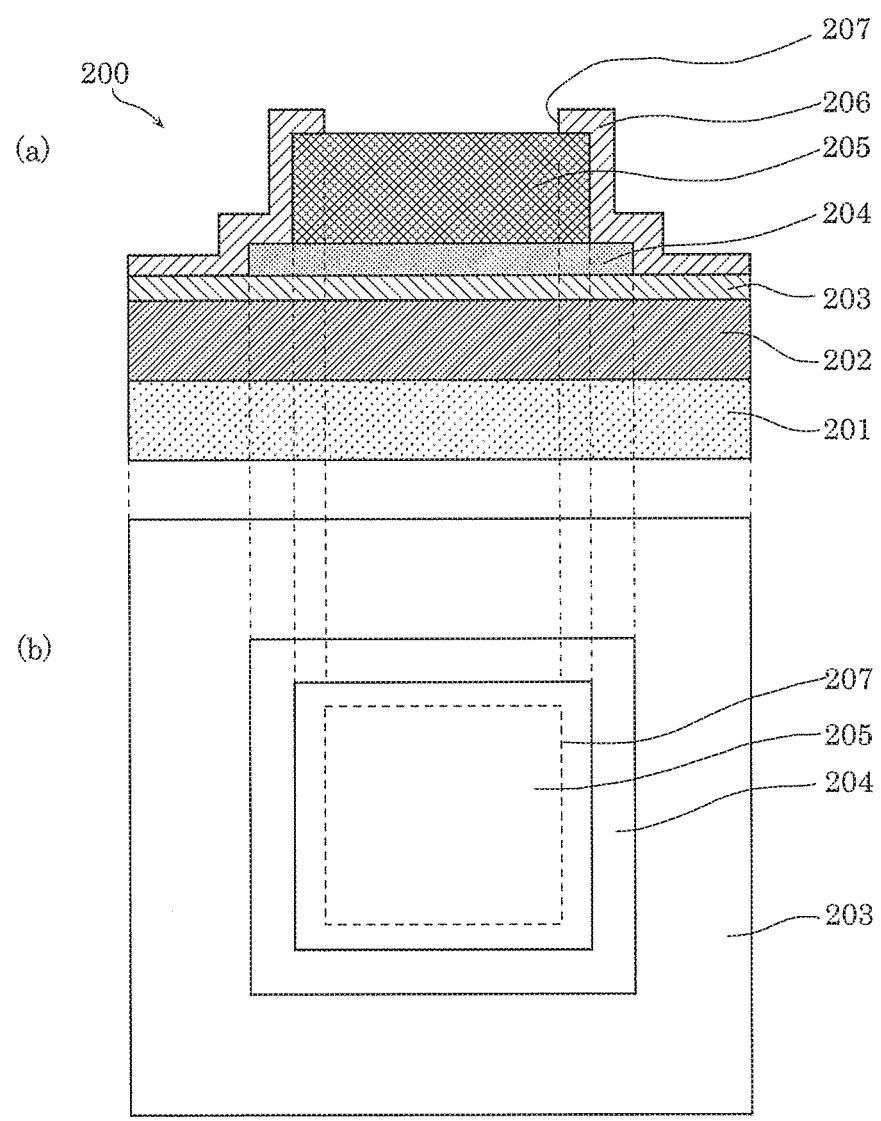
FIG. 2 is a schematic view illustrating a semiconductor device according to Embodiment 2.

Embodiment 2 will now be described with reference to the drawings. FIG. 2 is a schematic view illustrating the semiconductor device according to the present embodiment; (a) is a sectional view of the semiconductor device, and (b) is a plan view thereof. In (b) of FIG. 2, second protective film 206 is not illustrated.

Unlike semiconductor device 100 described in Embodiment 1, semiconductor device 200 according to the present embodiment has a first adhesive layer having a different shape.

As illustrated in (a) of FIG. 2, semiconductor device 200 according to the present embodiment includes substrate 201, semiconductor layer 202, first protective film 203, first adhesive layer 204, electrode pad 205, and second protective film 206. Substrate 201, semiconductor layer 202, and first protective film 203 have similar configurations of substrate 101, semiconductor layer 102, and first protective film 103 of semiconductor device 100 described in Embodiment 1, and therefore the detailed description thereof will be omitted.

As illustrated in (a) of FIG. 2, substrate 201 including silicon includes semiconductor layer 202 having a structure including an AlGaN layer, a GaN layer, a buffer layer, and a silicon substrate. Semiconductor layer 202 includes a buffer layer including a superlattice disposed on substrate 201, a GaN layer having a thickness of about 2 μm, and an AlGaN layer having a thickness of about 50 nm sequentially disposed, for example.

Semiconductor layer 202 includes first protective film 203 including at least one of $SiO_2$, $Si_3N_4$, AlN, $Al_2O_3$, $Ga_2O_3$, MgO, $ZrO_2$, $HfO_2$, and $La_2O_3$. First protective film 203 is formed by plasma CVD, for example.

First adhesive layer 204 is disposed on first protective film 203. First adhesive layer 204 is formed of a single layer of Ti, TiN, Ta, or TaN or a laminate including a combination thereof. First adhesive layer 204 has a thickness of about 200 nm. As illustrated in (a) and (b) of FIG. 2, first adhesive layer 204 is formed into a rectangular shape in a plan view.

Specifically, first adhesive layer 204 is disposed in a flat region having a surface roughness (RMS) of about 5 nm on first protective film 203. First adhesive layer 204 is deposited across the entire surface of first protective film 203 by sputtering, for example, and is dry etched, for example, into a frame shape having a predetermined dimension in a plan view.

In the next step, electrode pad 205 including at least one of Au, Al, and Cu and having a thickness of about 5 μm is formed in contact with first adhesive layer 204 by electrolysis plating, for example.

Specifically, electrode pad 205 is disposed such that portions of the upper surface and side surfaces of first adhesive layer 204 not contacting electrode pad 205 are horizontally projected from electrode pad 205 in a cross-sectional view.

In other words, electrode pad is to cover part of the upper surface of first adhesive layer 204 having a rectangular shape, excluding a predetermined width from the edges of the outer periphery of first adhesive layer 204 having a rectangular shape. Accordingly, in a plan view, as illustrated in (b) of FIG. 1, first adhesive layer 204 is disposed such that the central portion of first adhesive layer 204 is covered with electrode pad 205 while the edges of first adhesive layer 204 are projected from the outline of electrode pad 205 to surround the outer periphery of electrode pad 205.

The horizontal projection of first adhesive layer 204 from electrode pad 205 can have a length of 1 to 2 μm, for example. First adhesive layer 204 is at least projected from electrode pad 205.

After formation of electrode pad 205, second protective film 206 including at least one of $SiO_2$, $Si_3N_4$, AlN, $Al_2O_3$, $Ga_2O_3$, MgO, $ZrO_2$, $HfO_2$, and $La_2O_3$ is formed over first protective film 203, first adhesive layer 204, and electrode pad 205 by plasma CVD, for example. In second protective film 206 on electrode pad 205, first opening 207 is formed excluding a portion of second protective film 206 disposed on the edges of electrode pad 205. First opening 207 is formed into a rectangular shape in a plan view by dry etching. As a result, electrode pad 205 is exposed from first opening 207 of second protective film 206.

The moisture resistance of such a semiconductor device described above is typically affected by the adhesion between electrode pad 205 and second protective film 206. Such a semiconductor device, however, has larger irregularities on the surface of electrode pad 205 formed by electrolysis plating, for example, and has very weak intrinsic adhesion between electrode pad 205 and second protective film 206. These characteristics may lead to invasion of water through the interface between electrode pad 205 and second protective film 206, and thus the semiconductor device does not always have sufficient moisture resistance.

In the present embodiment, first adhesive layer 204 having high surface flatness is disposed in a region of first protective film 203 having low surface roughness. This first adhesive layer 204 ensures higher adhesion between first adhesive layer 204 and electrode pad 205 and between first adhesive layer 204 and second protective film 206 than that between electrode pad 205 and second protective film 206.

In this configuration, second protective film 206 is continuously to cover first protective film 203, side surfaces of first adhesive layer 204 and the upper surface continuing the side surfaces of first adhesive layer 204, and side surfaces of electrode pad 205 and the upper surface continuing the side surfaces of electrode pad 205. Accordingly, if electrode pad 205 and second protective film 206 do not have sufficient adhesion to prevent invasion of water, invasion of water can be prevented at the interface between first protective film 203 and first adhesive layer 204 and the interface between first adhesive layer 204 and electrode pad 205, in which higher adhesion is ensured.

The mechanism to prevent invasion of water is as described in Embodiment 1.

In this configuration, first adhesive layer 204 can prevent invasion of water through the interface between electrode pad 205 and second protective film 206.

Furthermore, this first adhesive layer 204 having a rectangular shape increases the contact area between first protective film 203 and first adhesive layer 204, enhancing the adhesion between first protective film 203 and first adhesive layer 204.

Embodiment 3

Figure 3:
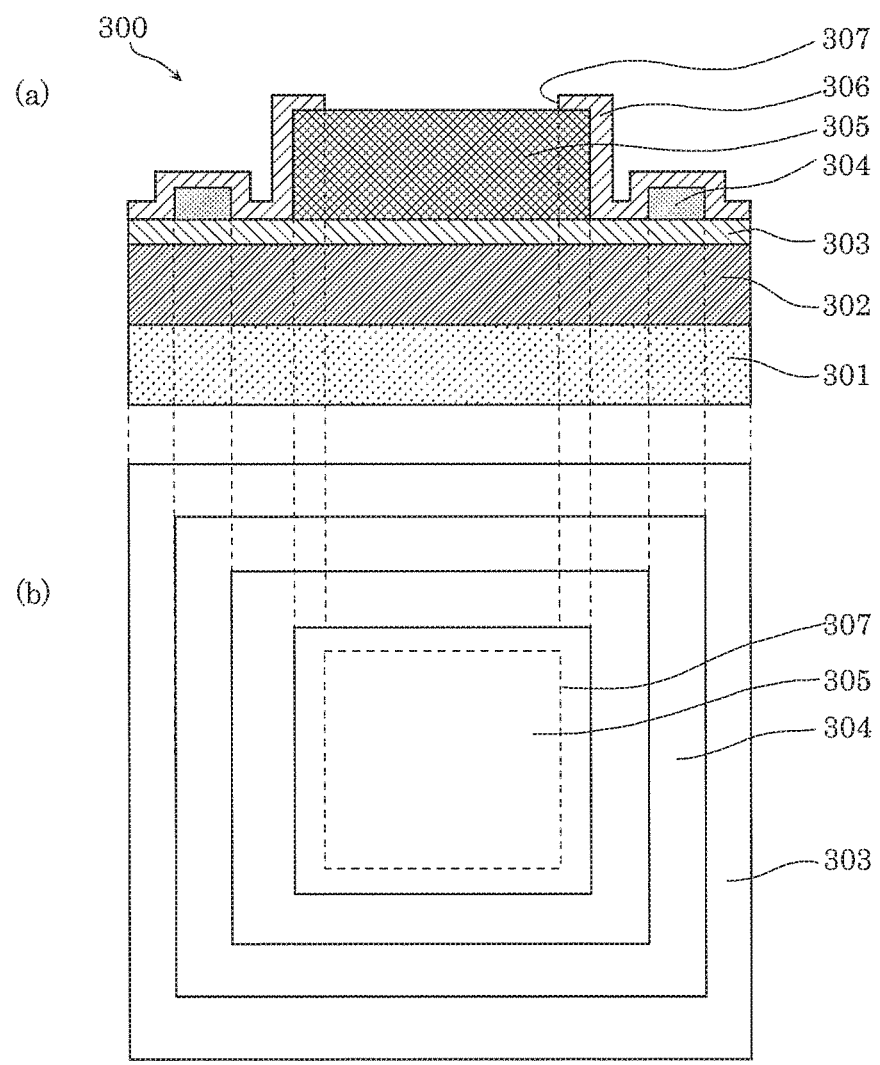
FIG. 3 is a schematic view illustrating a semiconductor device according to Embodiment 3.

Embodiment 3 will now be described with reference to the drawings. FIG. 3 is a schematic view illustrating the semiconductor device according to the present embodiment; (a) is a sectional view of the semiconductor device, and (b) is a plan view thereof. In (b) of FIG. 3, second protective film 306 is not illustrated.

Unlike semiconductor device 100 described in Embodiment 1, first adhesive layer is not in contact with electrode pad in semiconductor device 300 according to the present embodiment.

As illustrated in (a) of FIG. 3, substrate 301 including silicon includes semiconductor layer 302 having a structure including an AlGaN layer, a GaN layer, a buffer layer, and a silicon substrate. Semiconductor layer 302 includes a buffer layer including a superlattice disposed on substrate 301, a GaN layer having a thickness of about 2 μm, and an AlGaN layer having a thickness of about 50 nm sequentially disposed, for example.

Semiconductor layer 302 includes first protective film 303 including at least one of $SiO_2$, $Si_3N_4$, AlN, $Al_2O_3$, $Ga_2O_3$, MgO, $ZrO_2$, $HfO_2$, and $La_2O_3$. First protective film 303 is formed by plasma CVD, for example.

First adhesive layer 304 is disposed on first protective film 303. First adhesive layer 304 is formed of a single layer of Ti, TiN, Ta, or TAN or a laminate including a combination thereof, and has a thickness of about 200 nm. As illustrated in (a) and (b) of FIG. 3, first adhesive layer 304 is formed into the form of a rectangular frame in a plan view so as to surround electrode pad 305.

Specifically, first adhesive layer 304 is disposed in a flat region having a surface roughness (RMS) of about 5 nm on first protective film 303. First adhesive layer 304 is deposited across the entire surface of first protective film 303 by sputtering, for example, and is dry etched into a frame shape having a predetermined dimension in a plan view, which will be described in detail below.

Electrode pad 305 is disposed away from first adhesive layer 304 at an interval of about 5 to 10 μm, for example. Electrode pad 305 is formed of at least one of Au, Al, and Cu, and the upper surface and side surfaces of first adhesive layer 304 formed into a thickness of about 5 μm by electrolysis plating are spaced from electrode pad 305 at an interval of about 5 to 10 μm in a cross-sectional view, for example. In this embodiment, first adhesive layer 304 is disposed so as to surround the outer periphery of electrode pad 305. First adhesive layer 304 can have a width of 5 to 10 μm.

After formation of electrode pad 305, second protective film 306 including at least one of $SiO_2$, $Si_3N_4$, AlN, $Al_2O_3$, $Ga_2O_3$, MgO, $ZrO_2$, $HfO_2$, and $La_2O_3$ is formed over first protective film 303, first adhesive layer 304, and electrode pad 305 by plasma CVD, for example. In second protective film 306 on electrode pad 305, first opening 307 is formed excluding a portion of second protective film 306 disposed on the edges of electrode pad 305. First opening 307 is formed into a rectangular shape in a plan view by dry etching. As a result, electrode pad 305 is exposed from first opening 307.

The moisture resistance of such a semiconductor device described above is typically affected by the adhesion between electrode pad 305 and second protective film 306 and the adhesion between first protective film 303 and second protective film 306. Such a semiconductor device, however, has larger irregularities on the surface of electrode pad 305 formed by electrolysis plating, for example, and has very weak intrinsic adhesion between electrode pad 305 and second protective film 306. In the case where water invades through the interface between electrode pad 305 and second protective film 306, the moisture resistance of the semiconductor device depends on the adhesion between first protective film 303 and second protective film 306.

In the present embodiment, first adhesive layer 304 having high surface flatness is disposed in a region of first protective film 303 having low surface roughness. This first adhesive layer 304 ensures higher adhesion between the upper surface and side surfaces of first adhesive layer 304 and second protective film 306 and between the lower surface of first adhesive layer 304 and first protective layer 303 than that between first protective film 303 and second protective film 306.

In this configuration, second protective film 306 is continuously to cover first protective film 303, side surfaces of first adhesive layer 304 and the upper surface continuing the side surfaces of first adhesive layer 304, and side surfaces of electrode pad 305 and the upper surface continuing the side surfaces of electrode pad 305. Accordingly, if first protective film 303 and second protective film 306 do not have sufficient adhesion to prevent invasion of water, invasion of water can be prevented at the interface between first protective film 303 and first adhesive layer 304 and the interface between first adhesive layer 304 and second protective film 306, in which higher adhesion is ensured.

The mechanism to prevent invasion of water is as described in Embodiment 1.

In such a configuration, first adhesive layer 304 can prevent invasion of water through the interface between electrode pad 305 and second protective film 306 and the interface between first protective film 303 and second protective film 306.

Modification 1 of Embodiment 3

Figure 4:
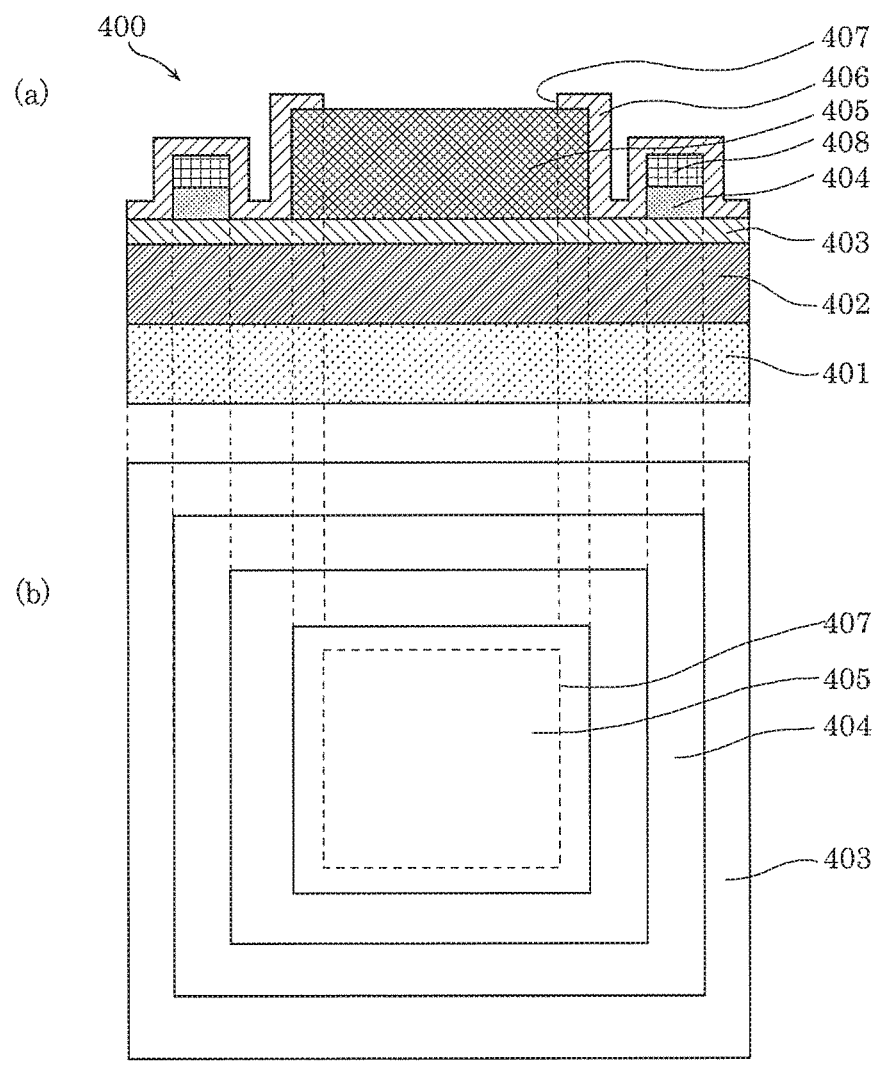
FIG. 4 is a schematic view illustrating the semiconductor device according to Embodiment 3.

Modification 1 of Embodiment 3 will now be described. FIG. 4 is a schematic view illustrating a semiconductor device according to an embodiment; (a) is a sectional view of the semiconductor device, and (b) is a plan view thereof. In (b) of FIG. 4, second protective film 406 is not illustrated.

Unlike semiconductor device 300 according to 300 according to Embodiment 3, the second adhesive layer is laminated on the first adhesive layer in semiconductor device 400 according to the present modification. Other configurations are similar to those of semiconductor device 300 described in Embodiment 3, and the detailed description thereof will be omitted.

As illustrated in (a) of FIG. 4, semiconductor device 400 includes substrate 401, semiconductor layer 402, first protective film 403, first adhesive layer 404, electrode pad 405, second protective film 406, and second adhesive layer 408.

Second adhesive layer 408 is formed of a single layer of Ti, TiN, Ta, or TaN or a laminate including a combination thereof, and is disposed on first adhesive layer 404 by sputtering and dry etching, for example. Second adhesive layer 408 has a thickness of about 200 nm. Second adhesive layer 408 is formed of a material highly adhesive to first adhesive layer 404. For example, for first adhesive layer 404 including Ti, second adhesive layer 408 is formed of TiN. Ti can be selected for first adhesive layer 404, and Ta, TiN, or TaN can be selected for second adhesive layer 408. An adhesive layer including at least one of Ti, TiN, Ta, and TaN may be disposed on the second adhesive layer disposed on first adhesive layer 404 to form a laminate adhesive layer including three or more layers including metal materials arbitrarily selected from Ti, TiN, Ta, and TaN.

Specifically, similarly to first adhesive layer 304 described in Embodiment 3, first adhesive layer 404 is formed across the entire surface of first protective film 403 by sputtering, and then second adhesive layer 408 is formed across the entire surface of first adhesive layer 404 by sputtering. Subsequently, first adhesive layer 404 and second adhesive layer 408 are formed into predetermined shapes by dry etching. In the present modification, as illustrated in (b) of FIG. 4, first adhesive layer 404 and second adhesive layer 408 are formed into frame shapes as in first adhesive layer 304 described in Embodiment 3.

In this configuration, by selecting a combination of metals having high affinity in adhesion between first protective film 403 and second protective film 406, first adhesive layer 404 and second adhesive layer 408 can prevent invasion of water through the interface of electrode pad 405 and second protective film 406.

Modification 2 of Embodiment 3

Figure 5:
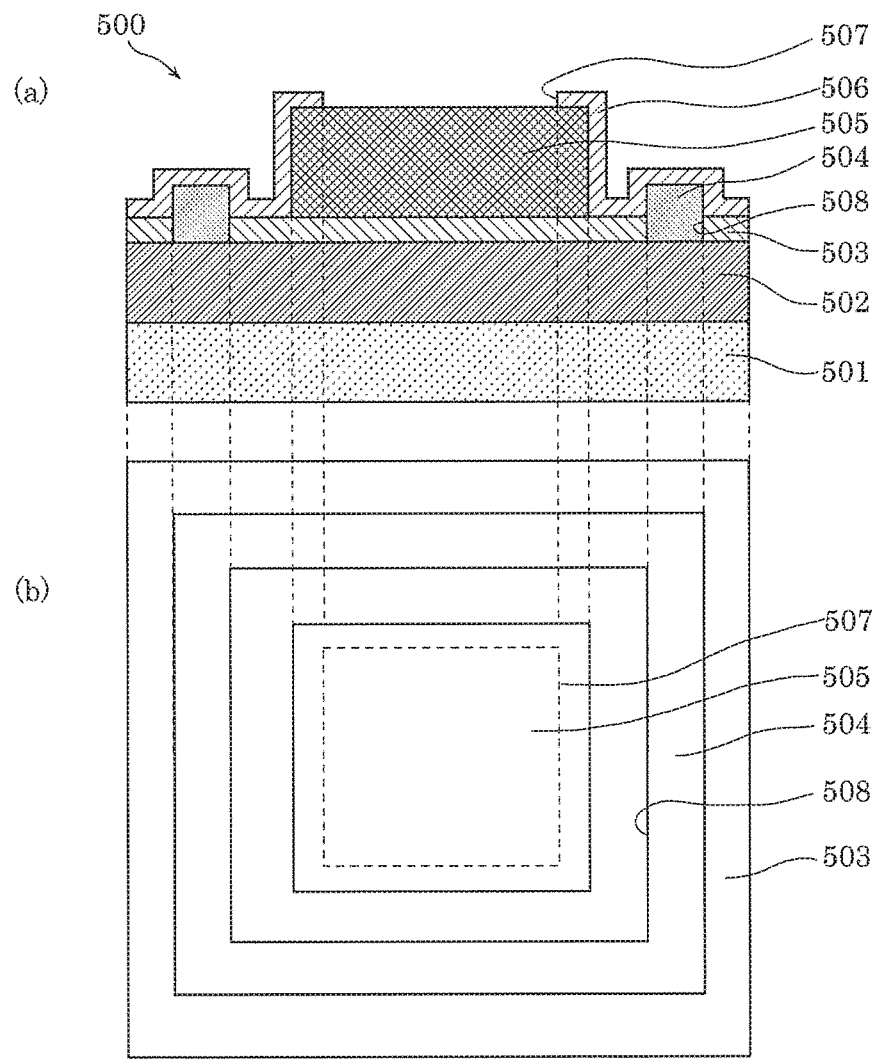
FIG. 5 is a schematic view illustrating the semiconductor device according to Embodiment 3.

Modification 2 of Embodiment 3 will now be described. FIG. 5 is a schematic view illustrating a semiconductor device according to an embodiment; (a) is a sectional view of the semiconductor device, and (b) is a plan view thereof. In (b) of FIG. 5, second protective film 506 is not illustrated.

Unlike semiconductor device 300 according to 300 according to Embodiment 3, first adhesive layer has an opening formed in first protective film in semiconductor device 500 according to the present modification. Other configurations are similar to those of semiconductor device 300 described in Embodiment 3, and the detailed description thereof will be omitted.

As illustrated in (a) of FIG. 5, semiconductor device 500 includes substrate 501, semiconductor layer 502, first protective film 503, first adhesive layer 504, electrode pad 505, and second protective film 506.

First adhesive layer 504 is formed of a single layer of Ti, TiN, Ta, or TaN or a laminate including a combination thereof. In first protective film 503 under first adhesive layer 504, second opening 508 penetrating to semiconductor layer 502 is formed by dry etching. As illustrated in (b) of FIG. 5, second opening 508 is formed into a frame shape surrounding electrode pad 505 in a plan view.

First adhesive layer 504 is formed inside second opening 508 on semiconductor layer 502 to have a thickness of about 200 nm from the surface of first protective film 503. Accordingly, first adhesive layer 504 penetrates through first adhesive layer 504 from the side of electrode pad 505 and securely adheres to semiconductor layer 502. First adhesive layer 504 is formed into a frame shape surrounding electrode pad 505 in a plan view.

In such a configuration, first adhesive layer 504 can ensure the adhesion between first protective film 503 and semiconductor layer 502 to sufficiently prevent invasion of water, even if first protective film 503 insufficiently prevents invasion of water.

Modification 3 of Embodiment 3

Figure 16:
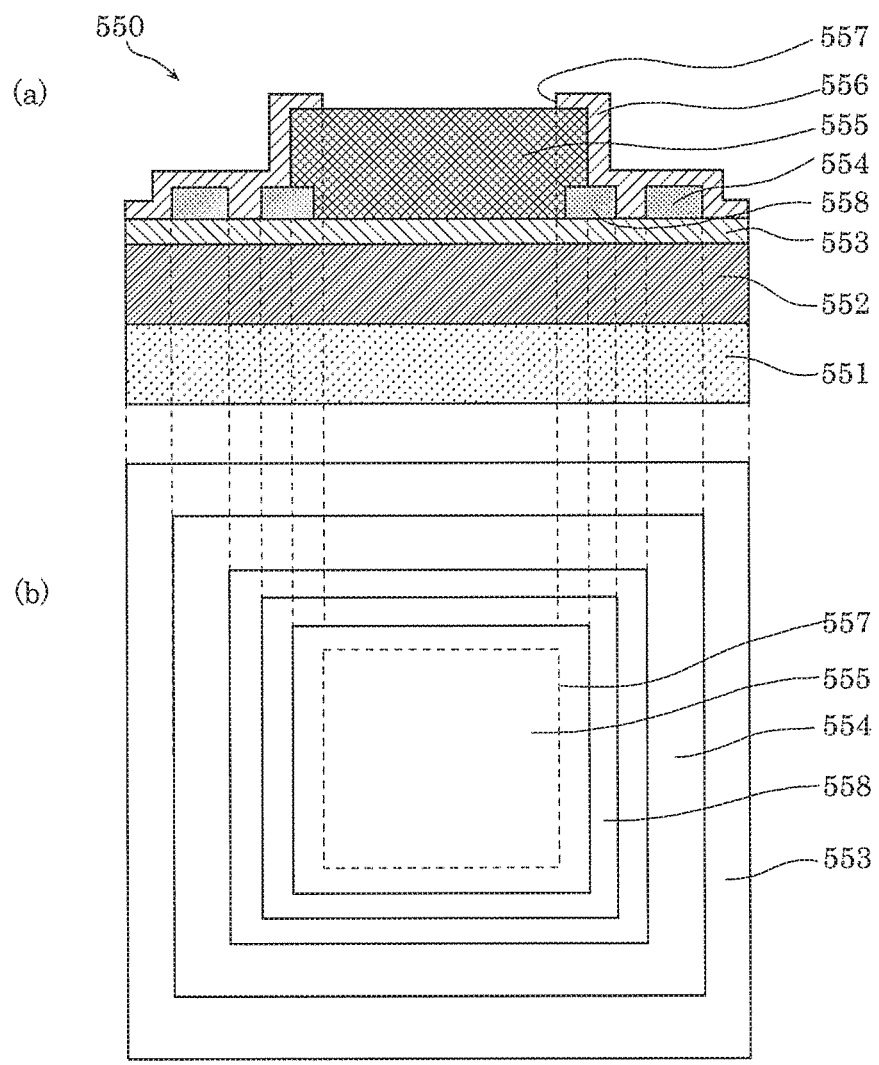
FIG. 16 is a schematic view illustrating a semiconductor device according to Embodiment 3.

Modification 3 of Embodiment 3 will now be described. FIG. 16 is a schematic view illustrating a semiconductor device according to an embodiment; (a) is a sectional view, and (b) is a plan view. In (b) of FIG. 16, second protective film 556 is not illustrated.

Unlike semiconductor device 300 according to Embodiment 3, the side surfaces and the upper surface of fourth adhesive layer 558 are in contact with electrode pad 555 in semiconductor device 550 according to the present modification. Specifically, electrode pad 555 is formed such that the upper surface and side surfaces of fourth adhesive layer 558 not contacting electrode pad 555 are horizontally projected from electrode pad 555 in a cross-sectional view, Fourth adhesive layer 558 is formed of a single layer of Ti, TiN, Ta, or TaN or a laminate including a combination thereof, and has a thickness of about 200 nm.

In other words, electrode pad 555 is disposed such that the inside and the inner periphery of fourth adhesive layer 558 having a frame shape, and part of the upper surface of fourth adhesive layer 558 are covered with electrode pad 555. As illustrated in (b) of FIG. 16, in a plan view, fourth adhesive layer 558 is formed such that electrode pad 555 is fitted into the inner periphery of fourth adhesive layer 558, the outer periphery of fourth adhesive layer 558 is projected from the outline of electrode pad 555 so as to surround the outer periphery of electrode pad 555. The horizontal projection of fourth adhesive layer 558 from electrode pad 555 can have a length of 1 to 2 μm. Fourth adhesive layer 558 is at least projected from electrode pad 555. Fourth adhesive layer 558 can have a width of 5 to 10 μm, for example.

After formation of electrode pad 555, second protective film 556 including at least one of $SiO_2$, $Si_3N_4$, AlN, $Al_2O_3$, $Ga_2O_3$, MgO, $ZrO_2$, $HfO_2$, and $La_2O_3$ is formed over first protective film 553, first adhesive layer 554, fourth adhesive layer 558, and electrode pad 555 by plasma CVD, for example. First opening 557 is formed on second protective film 556 disposed on electrode pad 555 excluding second protective film 556 disposed on the edges of electrode pad 555. First opening 557 is formed into a rectangular shape in seen in a plan view by dry etching, for example. As a result, electrode pad 555 is exposed from first opening 557 of second protective film 556.

The moisture resistance of such a semiconductor device described above is typically affected by the adhesion between electrode pad 555 and second protective film 556. Such a semiconductor device, however, has larger irregularities on the surface of electrode pad 555 formed by electrolysis plating, for example, and has very weak intrinsic adhesion between electrode pad 555 and second protective film 556. These characteristics may lead to invasion of water through the interface between electrode pad 555 and second protective film 556, and thus the semiconductor device does not always have sufficient moisture resistance.

In the modification of the present embodiment, first adhesive layer 554 and fourth adhesive layer 558 having high surface flatness are disposed in a region of first protective film 553 having low surface roughness. These first adhesive layer 554 and fourth adhesive layer 558 ensure higher adhesion between fourth adhesive layer 554 and electrode pad 555 and between first adhesive layer 554 and second protective film 556 than that between electrode pad 555 and second protective film 556.

In this configuration, second protective film 556 is continuously to cover first protective film 553, the side surfaces of first adhesive layer 554 and the upper surface thereof continuing the side surfaces, and the side surfaces of electrode pad 555 and the upper surface thereof continuing electrode pad 555. Accordingly, if electrode pad 555 and second protective film 556 do not have sufficient adhesion to prevent invasion of water, invasion of water can be prevented at the interface between first protective film 553 and fourth adhesive layer 558 and the interface between fourth adhesive layer 558 and electrode pad 555, in which higher adhesion is ensured.

As a result, the possibility of invasion of water beyond fourth adhesive layer 558 is reduced; if water invades beyond fourth adhesive layer 558, further invasion of water is prevented by the effect of first adhesive layer 554 described above. In other words, invasion of water into the power transistor can be completely prevented by the double adhesive layers, ensuring high moisture resistance of the power transistor.

Fourth adhesive layer 558 and first adhesive layer 554 are both including a single layer of Ti, TiN, Ta, or TaN or a laminate including a combination thereof. These layers are simultaneously formed by the same process without increasing the number of steps.

Thus, in semiconductor device 550 according to the present embodiment, fourth adhesive layer 558 and first adhesive layer 554 can prevent invasion of water through the interface between electrode pad 555 and second protective film 556.

Embodiment 4

Figure 6A:
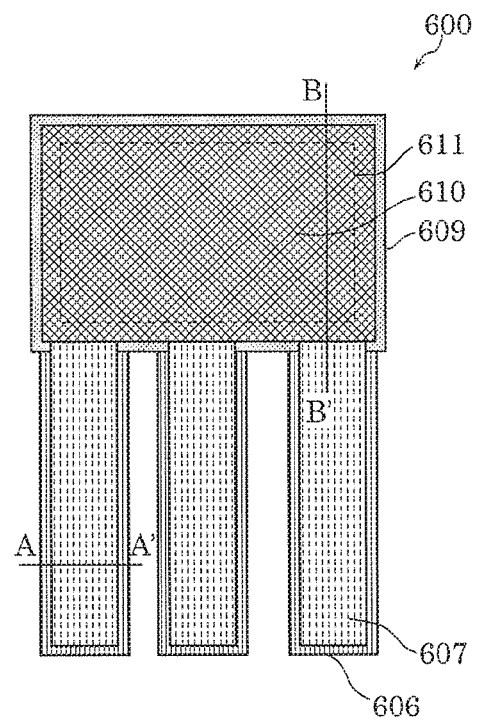
FIG. 6A is a plan view illustrating a semiconductor device according to Embodiment 4.
Figure 6B:
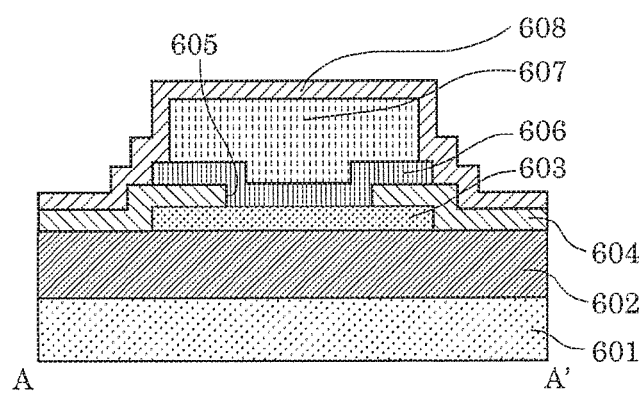
FIG. 6B is a sectional view of the semiconductor device taken along the line A-A' illustrated in FIG. 6A.
Figure 6C:
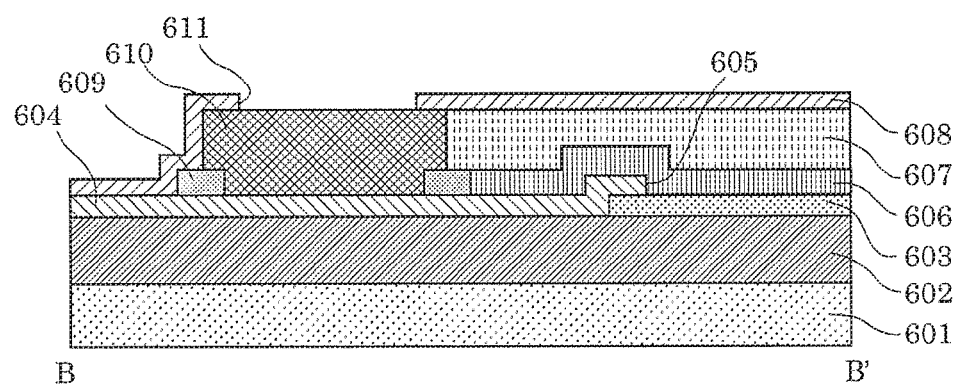
FIG. 6C is a sectional view of the semiconductor device taken along the line B-B' illustrated in FIG. 6A.

Embodiment 4 will now be described with reference to the drawings. FIG. 6A is a plan view illustrating a semiconductor device according to the present embodiment. FIG. 6B is a sectional view of the semiconductor device taken along the line A-A' illustrated in FIG. 6A. FIG. 6C is a sectional view of the semiconductor device taken along the line B-B' illustrated in FIG. 6A.

Unlike semiconductor device 100 described in Embodiment 1, semiconductor device 600 according to the present embodiment has an electrode pad structure and a so-called finger wiring structure connected to an electrode pad.

As illustrated in FIGS. 6A to 6C, semiconductor device 600 includes substrate 601, semiconductor layer 602, ohmic electrode 603, first protective film 604, third adhesive layer 606, finger wiring layer 607, second protective film 608, first adhesive layer 609, and electrode pad 610. First protective film 604 has second opening 605, and second protective film 608 has first opening 611. First adhesive layer 609 has a frame shape in a plan view as in adhesive layer 104 described in Embodiment 1.

As illustrated in FIG. 6B, substrate 601 including silicon includes semiconductor layer 602 having a structure including an AlGaN layer, a GaN layer, a buffer layer, and a silicon substrate. Semiconductor layer 602 includes a buffer layer including a superlattice disposed on substrate 601, a GaN layer having a thickness of about 2 μm, and an AlGaN layer having a thickness of about 50 nm sequentially disposed, for example.

On semiconductor layer 602, ohmic electrode 603 including a laminate of Ti and Al, for example, is formed, and first protective film 604 including at least one of $SiO_2$, $Si_3N_4$, AlN, $Al_2O_3$, $Ga_2O_3$, MgO, $ZrO_2$, $HfO_2$, and $La_2O_3$ is disposed on semiconductor layer 602 to cover ohmic electrode 603.

On first protective film 604 disposed on ohmic electrode 603, second opening 605 is formed by dry etching, for example. Third adhesive layer 606 including a single layer of Ti, TiN, Ta, or TaN or a laminate including a combination thereof is formed in second opening 605 and on first protective film 604. Third adhesive layer 606 having a thickness of about 200 nm is deposited in a flat region having a surface roughness (RMS) of about 5 nm by sputtering, and is dry etched into a predetermined shape.

In the next step, first finger wiring layer 607 including Au, Al, or Cu and having a thickness of about 5 μm is formed by electrolysis plating such that first finger wiring layer 607 is in contact with portions of the upper surface and side surfaces of third adhesive layer 606, and part of the upper surface and side surfaces of first finger wiring layer 607 not contacting third adhesive layer 606 are horizontally projected from first finger wiring layer 607 in a cross-sectional view. The horizontal projection of third adhesive layer 606 can have a length of 1 to 2 μm. Third adhesive layer 606 is at least projected from first finger wiring layer 607. First finger wiring layer 607 is a drain electrode, for example.

As illustrated in FIG. 6C, third adhesive layer 606 disposed on ohmic electrode 603 is connected to first adhesive layer 609. First finger wiring layer 607 is connected to electrode pad 610. First opening 611 is formed in second protective film 608 and electrode pad 610. First adhesive layer 609 and third adhesive layer 606 may be formed using different materials and different processes. In some embodiments, these layers are formed using the same material and the same process.

Electrode pad 610 and first finger wiring layer 607 may be formed using different materials and different processes. In some embodiments, these components are formed using the same material and the same process.

As a result of such formation, as illustrated in FIG. 6A, first adhesive layer 609 and third adhesive layer 606 are projected from electrode pad 610 and first finger wiring layer 607 so as to surround electrode pad 610 and first finger wiring layer 607 in a plan view, respectively.

The moisture resistance of semiconductor device 600 described above is typically affected by the adhesion of electrode pad 610 and first finger wiring layer 607 to second protective film 608. Such a semiconductor device, however, has larger irregularities on the surfaces of electrode pad 610 and first finger wiring layer 607 formed by electrolysis plating, for example, and has very weak intrinsic adhesion of electrode pad 610 and first finger wiring layer 607 to second protective film 608. These characteristics may lead to invasion of water through the interface of electrode pad 610 and second protective film 608 and the interface between first finger wiring layer 607 and second protective film 608 to the upper portion of first finger wiring layer 607, and thus the semiconductor device does not always have sufficient moisture resistance.

In the present embodiment, first adhesive layer 609 and third adhesive layer 606 having high surface flatness are disposed in regions of first protective film 604 having low surface roughness. These first adhesive layer 609 and third adhesive layer 606 ensure higher adhesion between first adhesive layer 609 and electrode pad 610, between second protective film 608 and first finger wiring layer 607, and between third adhesive layer 606 and first finger wiring layer 607 and second protective film 608 than the adhesion between electrode pad 610 and second protective film 608 and that between first finger wiring layer 607 and second protective film 608.

In this configuration, first adhesive layer 609 and third adhesive layer 606 can prevent invasion of water through the interface between electrode pad 610 and second protective film 608 to the upper portion of first finger wiring layer 607.

Modification 1 of Embodiment 4

Figure 7A:
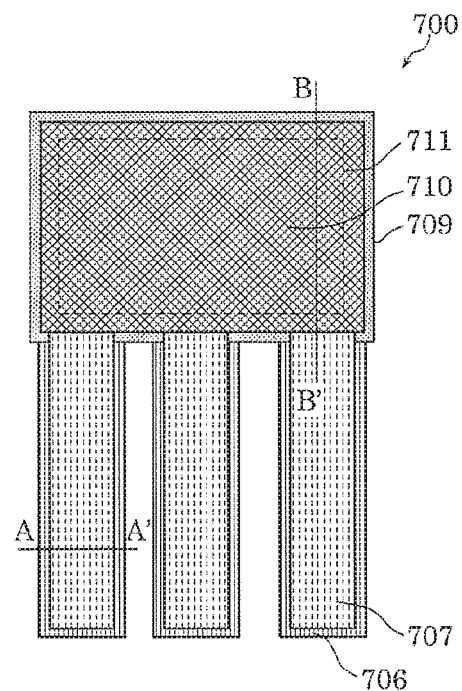
FIG. 7A is a plan view illustrating a semiconductor device according to Embodiment 4.
Figure 7B:
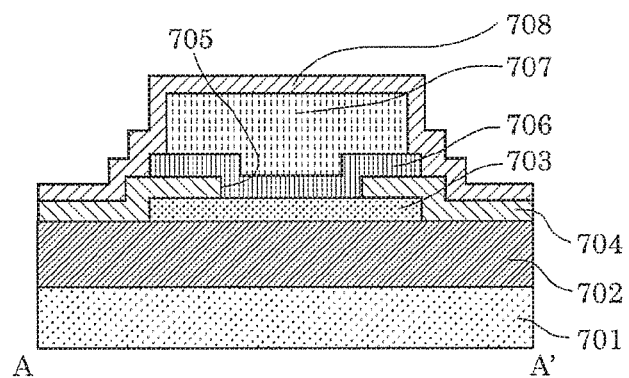
FIG. 7B is a sectional view of the semiconductor device taken along the line A-A' illustrated in FIG. 7A.
Figure 7C:
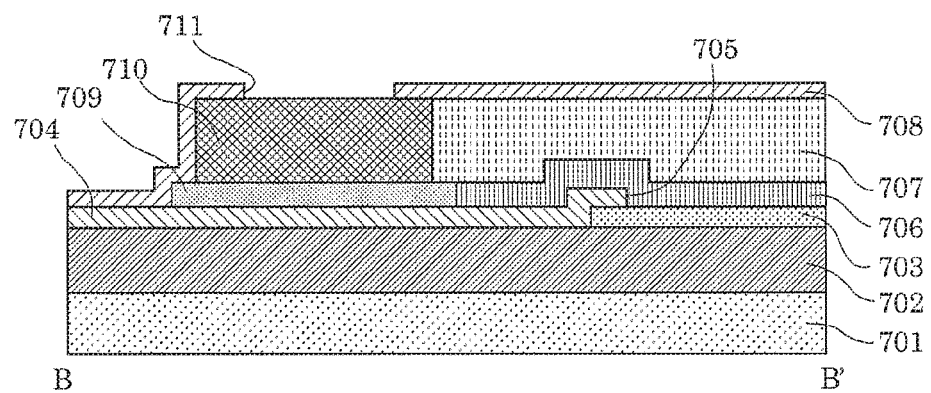
FIG. 7C is a sectional view of the semiconductor device taken along the line B-B' illustrated in FIG. 7A.

Modification 1 of Embodiment 4 will now be described. FIG. 7A is a plan view illustrating a semiconductor device according to the present embodiment of the present disclosure. FIG. 7B is a sectional view of the semiconductor device taken along the line A-A' illustrated in FIG. 7A. FIG. 7C is a sectional view of the semiconductor device taken along the line B-B' illustrated in FIG. 7A.

Unlike semiconductor device 600 according to Embodiment 4, the first adhesive layer in semiconductor device 700 according to this modification has a rectangular shape in a plan view. Other configurations are similar to those of semiconductor device 600 described in Embodiment 4, and the detailed description thereof will be omitted.

As illustrated in FIGS. 7A and 7B, third adhesive layer 706 disposed on ohmic electrode 703 is connected to first adhesive layer 709. First finger wiring layer 707 is connected to electrode pad 710. First opening 711 is formed in second protective film 708 and electrode pad 710.

As illustrated in FIG. 7C, first adhesive layer 709 has a rectangular shape in a plan view as in first adhesive layer 204 described in Embodiment 2.

First adhesive layer 709 and third adhesive layer 706 may be formed using different materials and different processes. In some embodiments, these components are formed using the same material and the same process. Electrode pad 710 and first finger wiring layer 707 may be formed using different materials and different processes. In some embodiments, these components are formed using the same material and the same process.

As a result of such formation, as illustrated in FIG. 7A, first adhesive layer 709 and third adhesive layer 706 are projected from electrode pad 710 and first finger wiring layer 707 so as to surround electrode pad 710 and first finger wiring layer 707, respectively.

In such a configuration, first adhesive layer 709 and third adhesive layer 706 provide the same effect of preventing invasion of water as that of semiconductor device 600 described in Embodiment 4.

Modification 2 of Embodiment 4

Figure 8A:
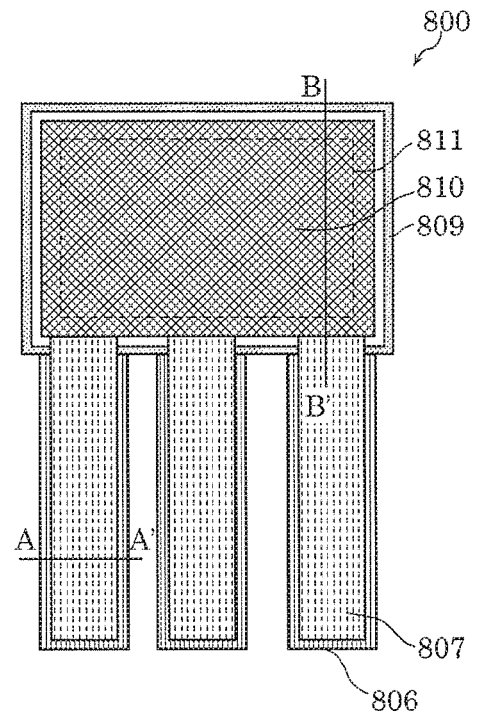
FIG. 8A is a plan view illustrating a semiconductor device according to Embodiment 4.
Figure 8B:
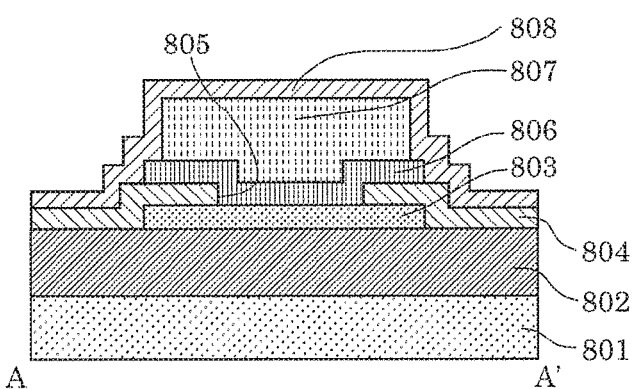
FIG. 8B is a sectional view of the semiconductor device taken along the line A-A' illustrated in FIG. 8A.
Figure 8C:
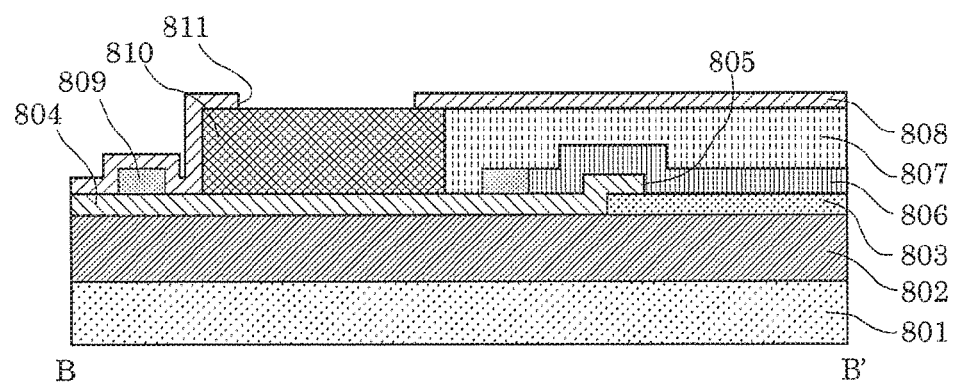
FIG. 8C is a sectional view of the semiconductor device taken along the line B-B' illustrated in FIG. 8A.

Modification 2 of Embodiment 4 will now be described. FIG. 8A is a plan view illustrating a semiconductor device according to the present embodiment of the present disclosure. FIG. 8B is a sectional view of the semiconductor device taken along the line A-A' illustrated in FIG. 8A. FIG. 8C is a sectional view of the semiconductor device taken along the line B-B' illustrated in FIG. 8A.

Unlike semiconductor device 600 according to Embodiment 4, the first adhesive layer is not in contact with the electrode pad in semiconductor device 800 according to the present modification. Other configurations are similar to those of semiconductor device 600 described in Embodiment 4, and the detailed description thereof will be omitted.

As illustrated in FIGS. 8A and 8B, third adhesive layer 806 disposed on ohmic electrode 803 is connected to first adhesive layer 809. First finger wiring layer 807 is connected with electrode pad 810. First opening 811 is formed in second protective film 808 and electrode pad 810.

As illustrated in FIG. 8C, similarly to first adhesive layer 304 described in Embodiment 3, first adhesive layer 809 is not in contact with electrode pad 810, and is disposed so as to surround electrode pad 810. First adhesive layer 809 has a rectangular shape in a plan view.

First adhesive layer 809 and third adhesive layer 806 may be formed using different materials and different processes. In some embodiments, these layers are formed using the same material and the same process. Electrode pad 810 and first finger wiring layer 807 may be formed using different materials and different processes. In some embodiments, these layers are formed using the same material and the same process.

As a result of such formation, as illustrated in FIG. 8A, first adhesive layer 809 and third adhesive layer 806 are projected from electrode pad 810 and first finger wiring layer 807 so as to surround electrode pad 810 and first finger wiring layer 807, respectively.

In such a configuration, first adhesive layer 809 and third adhesive layer 806 provide the same effect of preventing invasion of water as that of semiconductor device 600 described in Embodiment 4.

The present modification may be combined with Modification 3 of Embodiment 3. Namely, an adhesive layer may be disposed continuously surrounding electrode pad 810 while the side surfaces and the upper surface of the adhesive layer are in contact with electrode pad 810. In such a configuration, the adhesive layer including Ti, TIN, Ta, TaN, or a laminate including a combination thereof is disposed across the entire region of first finger wiring layer 807, and is projected from first finger wiring layer 807. As a result, the effect of preventing invasion of water is further enhanced.

Embodiment 5

Figure 9A:
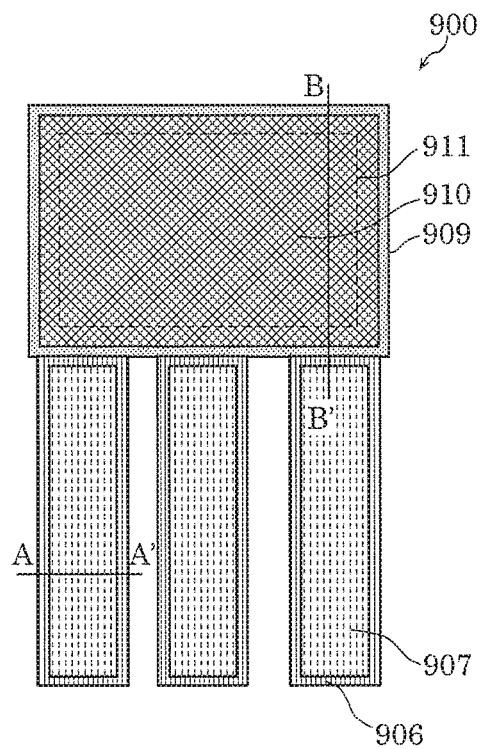
FIG. 9A is a plan view illustrating a semiconductor device according to Embodiment 5.
Figure 9B:
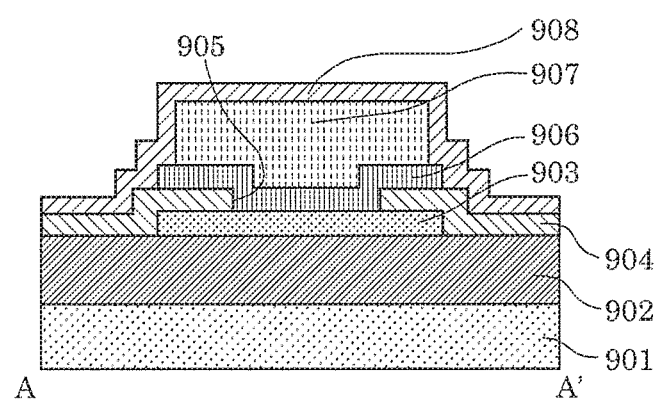
FIG. 9B is a sectional view of the semiconductor device taken along the line A-A' illustrated in FIG. 9A.
Figure 9C:
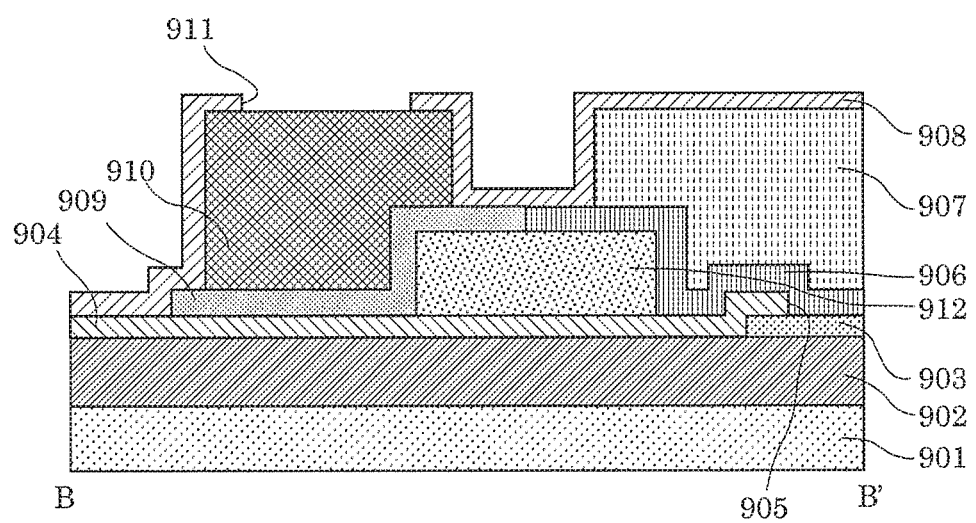
FIG. 9C is a sectional view of the semiconductor device taken along the line B-B' illustrated in FIG. 9A.

Embodiment 5 will now be described with reference to the drawings. FIG. 9A is a plan view illustrating a semiconductor device according to the present embodiment. FIG. 9B is a sectional view of the semiconductor device taken along the line A-A' illustrated in FIG. 9A. FIG. 9C is a sectional view of the semiconductor device taken along the line B-B' illustrated in FIG. 9A.

Unlike semiconductor device 600 according to Embodiment 4, the electrode pad is not in direct contact with the first finger wiring layer, and is connected through the second finger wiring layer in semiconductor device 900 according to the present modification. Other configurations are similar to those of semiconductor device 600 described in Embodiment 4, and the detailed description thereof will be omitted.

As illustrated in FIG. 9B, substrate 901 including silicon includes semiconductor layer 902 having a structure including an AlGaN layer, a GaN layer, a buffer layer, and a silicon substrate. Semiconductor layer 902 includes a buffer layer including a superlattice disposed on substrate 901, for example, a GaN layer having a thickness of about 2 μm, and an AlGaN layer having a thickness of about 50 nm sequentially disposed, for example.

On semiconductor layer 902, ohmic electrode 903 including a laminate Ti and Al, for example, is formed, and first protective film 904 including at least one of $SiO_2$, $Si_3N_4$, AlN, $Al_2O_3$, $Ga_2O_3$, MgO, $ZrO_2$, $HfO_2$, and $La_2O_3$ is disposed on semiconductor layer 902 to cover ohmic electrode 903.

On first protective film 904 disposed on ohmic electrode 903, second opening 905 is formed by dry etching, for example. Third adhesive layer 906 including a single layer of Ti, TiN, Ta, or TaN or a laminate including a combination thereof is formed in second opening 905 and on first protective film 904. Third adhesive layer 906 having a thickness of about 200 nm is deposited in a flat region having a surface roughness (RMS) of about 5 nm by sputtering, and is dry etched into a predetermined shape.

In the next step, first finger wiring layer 907 including at least one of Au, Al, and Cu and having a thickness of about 5 μm is formed by electrolysis plating such that first finger wiring layer 907 is in contact with part of the upper surface and part of side surfaces of third adhesive layer 906, and the remaining part of the upper surface and side surfaces of third adhesive layer 906 not contacting first finger wiring layer 907 is horizontally projected from first finger wiring layer 907 as illustrated in FIG. 9B.

The horizontal projection of third adhesive layer 906 can have a length of 1 to 2 μm, for example. Third adhesive layer 906 is at least projected from first finger wiring layer 907. First finger wiring layer 907 is a drain electrode, for example.

As illustrated in FIG. 9C, second opening 905 is formed through dry etching of first protective film 904 disposed on ohmic electrode 903. On first protective film 904, second finger wiring layer 912 including at least one of Au, Al, and Cu and having a thickness of about 5 μm is formed to electrically connect electrode pad 910 to first finger wiring layer 907.

Furthermore, first adhesive layer 909 and third adhesive layer 906 are to cover part of the upper surface and side surfaces of second finger wiring layer 912. As illustrated in FIG. 9C, first adhesive layer 909 is connected to third adhesive layer 906. First adhesive layer 909 and third adhesive layer 906 may be formed using different materials and different processes. In some embodiments, these layers are formed using the same material and the same process.

As a result of such formation, as illustrated in illustrated in FIG. 9A, first adhesive layer 909 and third adhesive layer 906 are projected from electrode pad 910 and first finger wiring layer 907 so as to surround electrode pad 910 and first finger wiring layer 907, respectively.

The moisture resistance of the semiconductor device described above is typically affected by the adhesion of electrode pad 910 and first finger wiring layer 907 to second protective film 908. Such a semiconductor device, however, has larger irregularities on the surfaces of electrode pad 910 and first finger wiring layer 907 formed by electrolysis plating, for example, and has very weak intrinsic adhesion of electrode pad 910 and first finger wiring layer 907 to second protective film 908. These characteristics may lead to invasion of water through the interface of electrode pad 910 and second protective film 908 and the interface between first finger wiring layer 907 and second protective film 908, and thus the semiconductor device does not always have sufficient moisture resistance.

In the present embodiment, first adhesive layer 909 and third adhesive layer 906 having high surface flatness are disposed in a region of first protective film 904 having surface roughness. These first adhesive layer 909 and third adhesive layer 906 ensure higher adhesion between first adhesive layer 909 and electrode pad 910, between second protective film 908 and first finger wiring layer 907, and between third adhesive layer 906 and first finger wiring layer 907 and second protective film 908 than the adhesion of electrode pad 910 and first finger wiring layer 907 to second protective film 908.

Furthermore, electrical connection of electrode pad 910 to first finger wiring layer 907 through second finger wiring layer 912 can prevent invasion of water to first finger wiring layer 907.

In this configuration, first adhesive layer 909 and third adhesive layer 906 can prevent invasion of water through the interface between electrode pad 910 and second protective film 908 to first finger wiring layer 907.

Embodiment 6

Figure 10A:
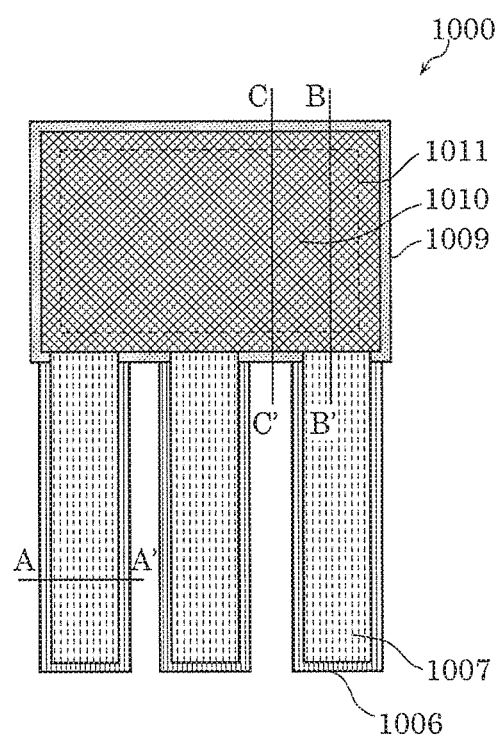
FIG. 10A is a plan view illustrating a semiconductor device according to Embodiment 6.
Figure 10B:
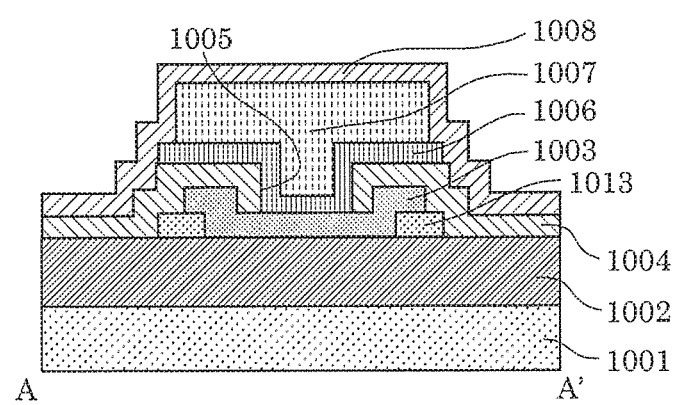
FIG. 10B is a sectional view of the semiconductor device taken along the line A-A' illustrated in FIG. 10A.
Figure 10C:
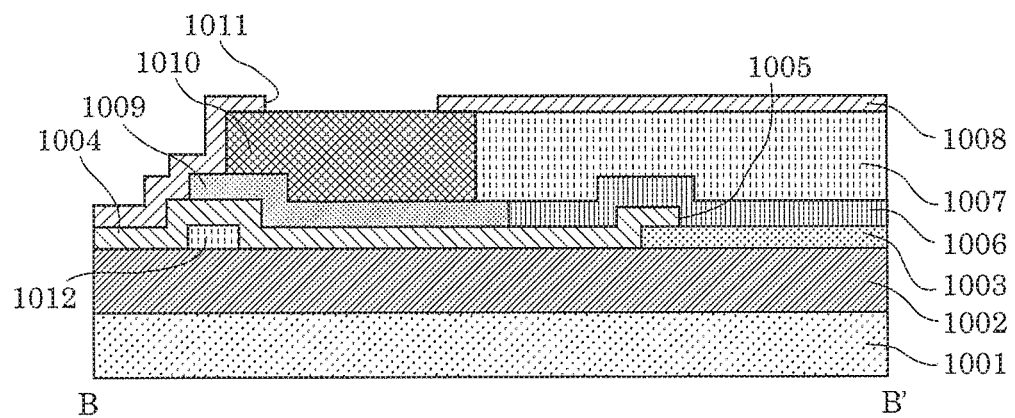
FIG. 10C is a sectional view of the semiconductor device taken along the line B-B' illustrated in FIG. 10A.
Figure 10D:
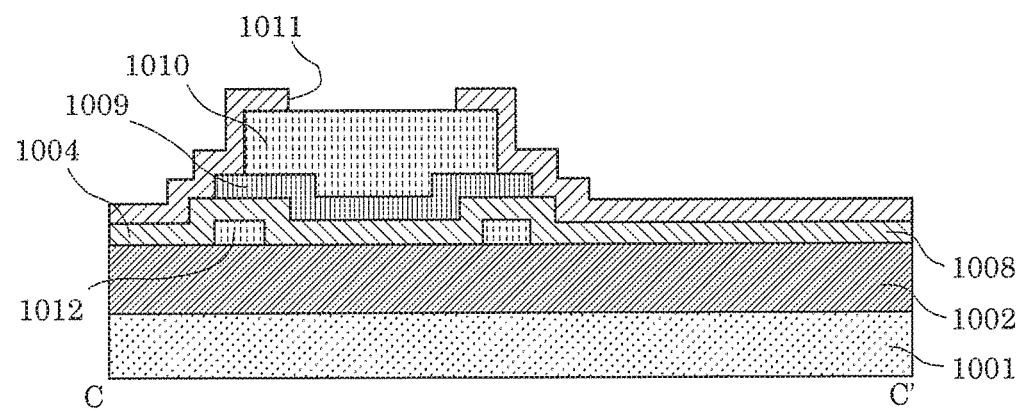
FIG. 10D is a sectional view of the semiconductor device taken along the line C-C' illustrated in FIG. 10A.

Embodiment 6 will now be described, in with reference to the drawings. FIG. 10A is a plan view illustrating a semiconductor device according to the present embodiment. FIG. 10B is a sectional view of the semiconductor device taken along the line A-A' illustrated in FIG. 10A. FIG. 10C is a sectional view of the semiconductor device taken along the line B-B' illustrated in FIG. 10A. FIG. 10D is a sectional view of the semiconductor device takes along the line C-C' illustrated in FIG. 10A.

Unlike semiconductor device 600 according to Embodiment 4, semiconductor device 1000 according to the present modification includes a first p-type layer, a second p-type layer, an ohmic electrode, and a third adhesive layer. Other configurations are similar to those of semiconductor device 600 described in Embodiment 4, and the detailed description thereof will be omitted.

As illustrated in FIG. 10A, substrate 1001 including silicon includes semiconductor layer 1002 having a structure including an AlGaN layer, a GaN layer, a buffer layer, and a silicon substrate. Semiconductor layer 1002 includes a buffer layer including a superlattice, a GaN layer having a thickness of about 2 μm, and, an AlGaN layer having a thickness of about 50 nm sequentially disposed, for example. Second p-type layer 1013 including a p-type GaN layer having a thickness of about 200 nm is disposed on semiconductor layer 1002. The electric field applied to semiconductor layer 1002 can be relaxed at the edge of third adhesive layer 1006 by second p-type layer 1013.

Second p-type layer 1013 is formed of at least one material selected from Si, GaN, AlGaN, AlN, InN, InAlN, InAlGaN, NiO, FeO$_2$, CoO$_2$, MnO, CuO, ZnO, In$_2$O$_3$, SnO$_2$, Y$_2$O$_3$, SrTiO$_3$, SrPbO$_3$, and TiO$_2$. Magnesium (Mg) may be used as a p-type doping material in a concentration of about $1\times10^{-18}$ cm$^{-3}$ to $1\times10^{-21}$ cm$^{-3}$. Second p-type layer 1013 has a thickness of about 50 nm to 300 nm, and preferably has a thickness of about 150 nm to 250 nm.

Ohmic electrode 1003 including a laminate of Ti and Al is formed in contact with part of the upper surface of second p-type layer 1013, the side surfaces of second p-type layer 1013, and the upper surface of semiconductor layer 1002; and first protective film 1004 including at least one of SiO$_2$, Si$_3$N$_4$, AlN, Al$_2$O$_3$, Ga$_2$O$_3$, MgO, ZrO$_2$, HfO$_2$, and La$_2$O$_3$ is disposed on semiconductor layer 1002 so as to cover ohmic electrode 1003 and the remaining part of the upper surface and side surfaces of second p-type layer 1013 not contacting ohmic electrode 1003.

Second opening 1005 is disposed on first protective film 1004 disposed on ohmic electrode 1003 by dry etching, for example. First protective film 1004 is formed of a single layer of Ti, TiN, Ta, or TaN or a laminate including a combination thereof, and includes third adhesive layer 1006.

Third adhesive layer 1006 having a thickness of about 200 nm is deposited in a flat region having a surface roughness (RMS) of about 5 nm by sputtering, for example, and is dry etched into a predetermined shape.

In a cross-sectional view, the side surfaces of third adhesive layer 1006 can be located at the same horizontal position as that of second p-type layer 1013 not contacting ohmic electrode 1003 as illustrated in FIG. 10B. Second p-type layer 1013 may be horizontally projected from third adhesive layer 1006.

In the next step, first finger wiring layer 1007 including Au, Al, or Cu and having a thickness of about 5 μm is formed by electrolysis plating in contact with part of the upper surface and side surfaces of third adhesive layer 1006. In a cross-sectional view, part of the upper surface and side surfaces of third adhesive layer 1006 not contacting first finger wiring layer 1007 are formed so as to be horizontally projected from first finger wiring layer 1007.

Third adhesive layer 1006 can have a length of 1 to 2 μm, for example. Third adhesive layer 1006 is at least projected from first finger wiring layer 1007. First finger wiring layer 1007 is a drain electrode, for example.

As illustrated in FIGS. 10C and 10D, first p-type layer 1012 is disposed on semiconductor layer 1002 disposed immediately under first adhesive layer 1009. The electric field applied to semiconductor layer 1002 can be relaxed at the edge of first adhesive layer 1009 by First p-type layer 1012.

First p-type layer 1012 is formed of at least one material selected from Si, GaN, AlGaN, AlN, InN, InAlN, InAlGaN, NiO, FeO$_2$, CoO$_2$, MnO, CuO, ZnO, In$_2$O$_3$, SnO$_2$, Y$_2$O$_3$, SrTiO$_3$, SrPbO$_3$, and TiO$_2$. Magnesium (Mg) can be used as a p-type doping material in a concentration of about $1\times10^{-18}$ cm$^{-3}$ to $1\times10^{-21}$ cm$^{-3}$, for example. First p-type layer 1012 can have a thickness of about 50 nm to 300 nm, and preferably has a thickness of about 150 nm to 250 nm.

In a cross-sectional view, the side surface of first adhesive layer 1009 can be located at the same horizontal position as that of first p-type layer 1012. First p-type layer 1012 may be horizontally projected from first adhesive layer 1009.

Third adhesive layer 1006 disposed on ohmic electrode 1003 is connected to first adhesive layer 1009. First finger wiring layer 1007 is connected to electrode pad 1010. First opening 1011 is formed in second protective film 1008 and electrode pad 1010.

In a plan view, first p-type layer 1012 disposed on semiconductor layer 1002 is formed immediately under electrode pad 1010 so as to surround electrode pad 1010, and is electrically connected to second p-type layer 1013. In a plan view, electrode pad 1010 is surrounded by first adhesive layer 1009 and first p-type layer 1012, and first finger wiring layer 1007 is surrounded by third adhesive layer 1006 and second p-type layer 1013.

First adhesive layer 1009 and third adhesive layer 1006 may be formed using different materials and different processes. In some embodiments, these layers are formed using the same material and the same process.

Electrode pad 1010 and first finger wiring layer 1007 may be formed using different materials and different processes. In some embodiments, these layers are formed using the same material and the same process.

First p-type layer 1012 and second p-type layer can be formed by the same process, and are electrically connected while these layers may contain a p-type carrier in different concentrations. In some embodiments, first p-type layer 1012 and second p-type layer 1013 are disposed in a continuous form. First p-type layer 1012 and second p-type layer 1013 may be disposed in a discontinuous form.

As a result of such formation, as illustrated in FIGS. 10A to 10D, first adhesive layer 1009 and third adhesive layer 1006 are projected from electrode pad 1010 and first finger wiring layer 1007 so as to surround electrode pad 1010 and first finger wiring layer 1007, respectively. In a plan view, first p-type layer 1012 and second p-type layer 1013 are formed in the same regions as those of electrode pad 1010 and first finger wiring layer 1007, or are projected therefrom, respectively; and first p-type layer 1012 and second p-type layer 1013 are formed so as to surround electrode pad 1010 and first finger wiring layer 1007, respectively.

The moisture resistance of semiconductor device 1000 described above is typically affected by the adhesion of electrode pad 1010 and first finger wiring layer 1007 to second protective film 1008. Such a semiconductor device, however, has larger irregularities on the surface of electrode pad 1010 formed by electrolysis plating, for example, and has very weak intrinsic adhesion of electrode pad 1010 and first finger wiring layer 1007 to second protective film 1008. These characteristics may lead to invasion of water through the interface between electrode pad 1010 and second protective film 1008 and the interface between first finger wiring layer 1007 and second protective film 1008, and thus the semiconductor device does not always have sufficient moisture resistance.

In the present embodiment, first adhesive layer 1009 and third adhesive layer 1006 having high surface flatness are disposed in a region of first protective film 1004 having low surface roughness. These first adhesive layer 1009 and third adhesive layer 1006 ensure higher adhesion between first adhesive layer 1009 and electrode pad 1010, between second protective film 1008 and first finger wiring layer 1007, and between third adhesive layer 1006, first finger wiring layer 1007, and second protective film 1008 than the adhesion of electrode pad 1010 and first finger wiring layer 1007 to second protective film 1008.

Furthermore, the electric field applied to semiconductor layer 1002 can be relaxed at the edge of first adhesive layer 1009 and the edge of third adhesive layer 1006 by first p-type layer 1012 and second p-type layer 1013 surrounding electrode pad 1010 and first finger wiring layer 1007, respectively. In such a configuration, invasion of water through the interface between electrode pad 1010 and second protective film 1008 can be further prevented by relaxation of the electric field by first p-type layer 1012 and second p-type layer 1013, and thus first adhesive layer 1009 and third adhesive layer 1006 can prevent invasion of water.

Figure 11A:
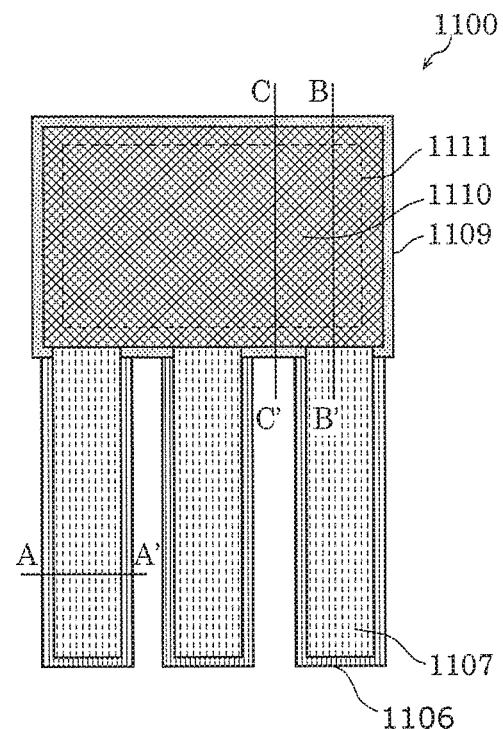
FIG. 11A is a plan view illustrating the semiconductor device according to Embodiment 6.
Figure 11B:
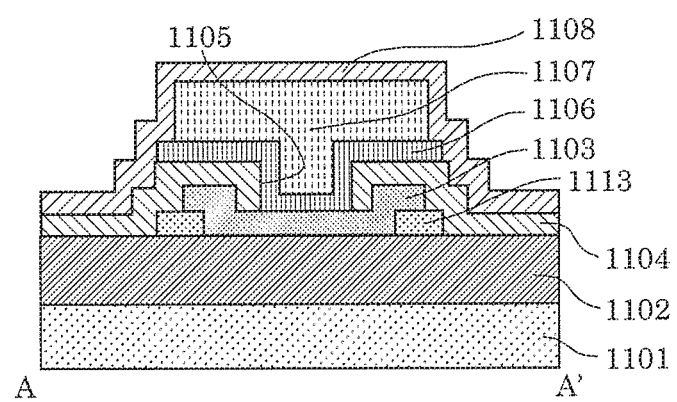
FIG. 11B is a sectional view of the semiconductor device taken along the line A-A' illustrated in FIG. 11A.
Figure 11C:
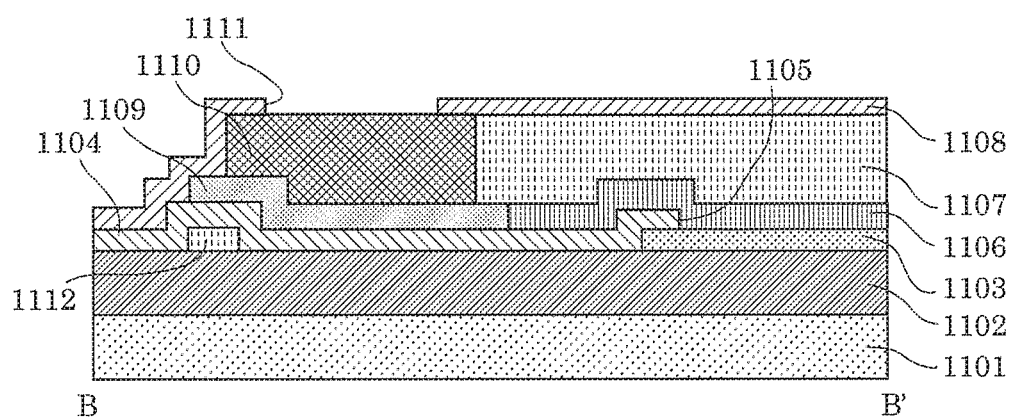
FIG. 11C is a sectional view of the semiconductor device taken along the line B-B' illustrated in FIG. 11A.
Figure 11D:
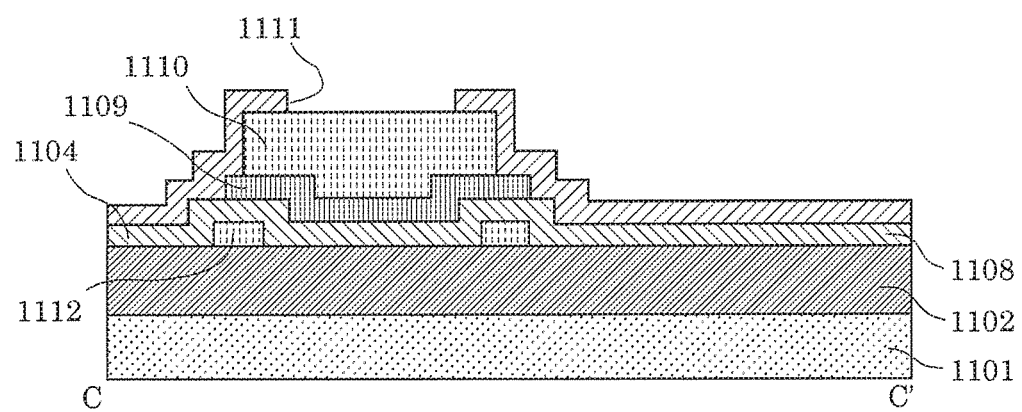
FIG. 11D is a sectional view of the semiconductor device taken along the line C-C' illustrated in FIG. 11A.

As illustrated in FIGS. 11B to 11D, the same effect is also attained if first p-type layer 1012 and second p-type layer 1013 in FIGS. 10B to 10D are replaced with first n-type layer 1112 and second n-type layer 1113, respectively.

Comparative Example

Figure 12:
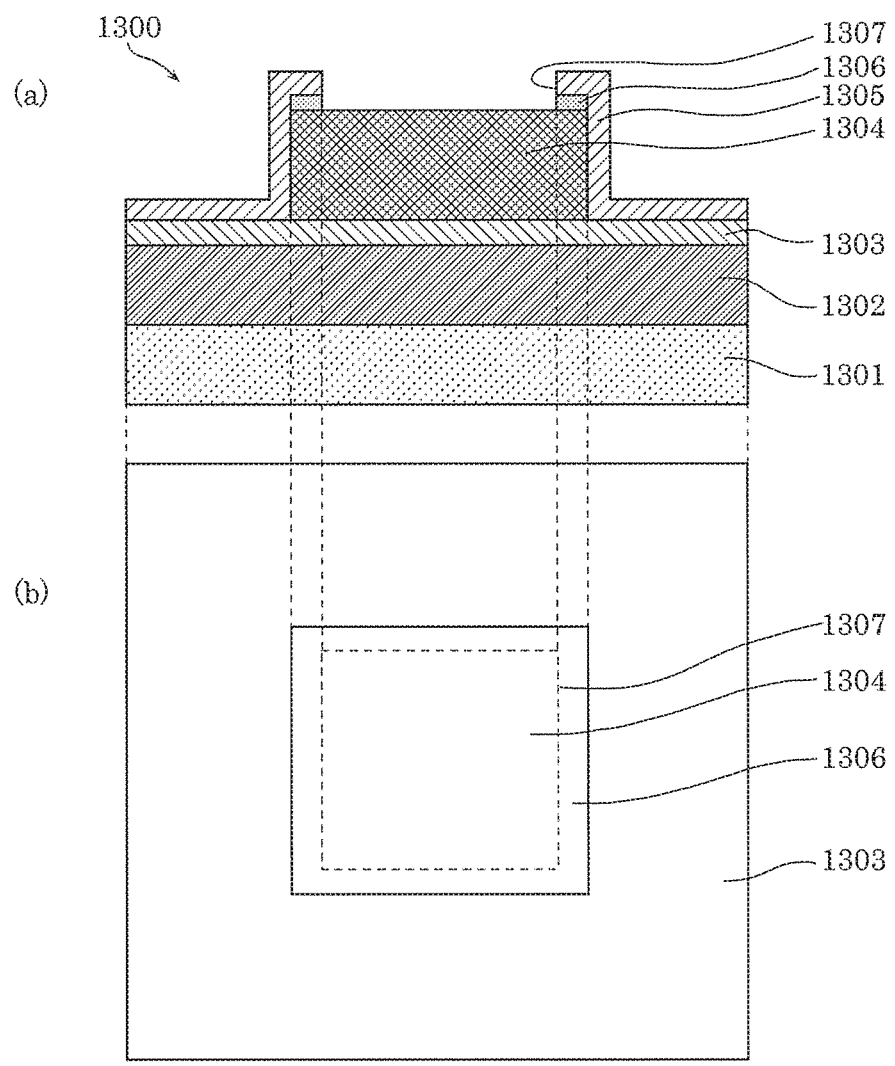
FIG. 12 is a semiconductor device according to a related art having a similar structure.
Figure 13:
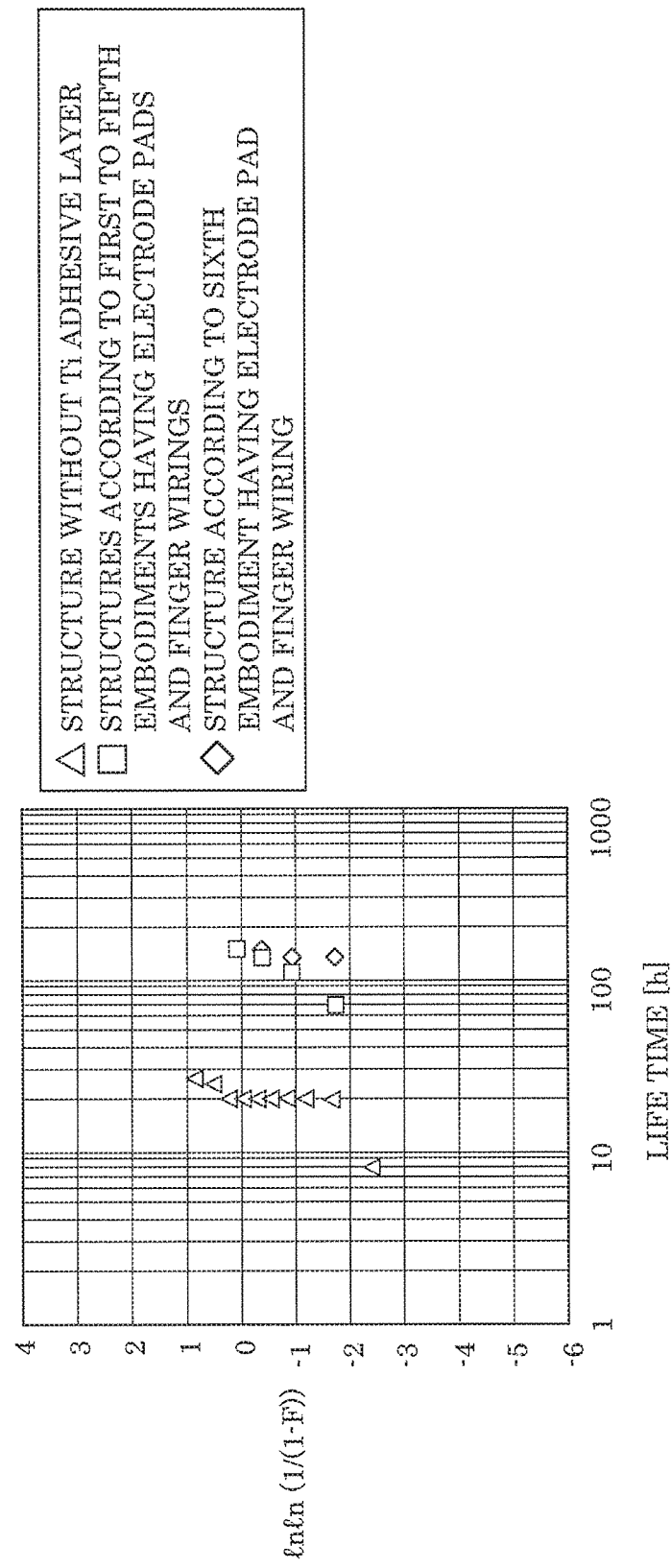
FIG. 13 shows the results of examination of the moisture resistance of the semiconductor devices according to Embodiments 1 to 6.
Figure 14:
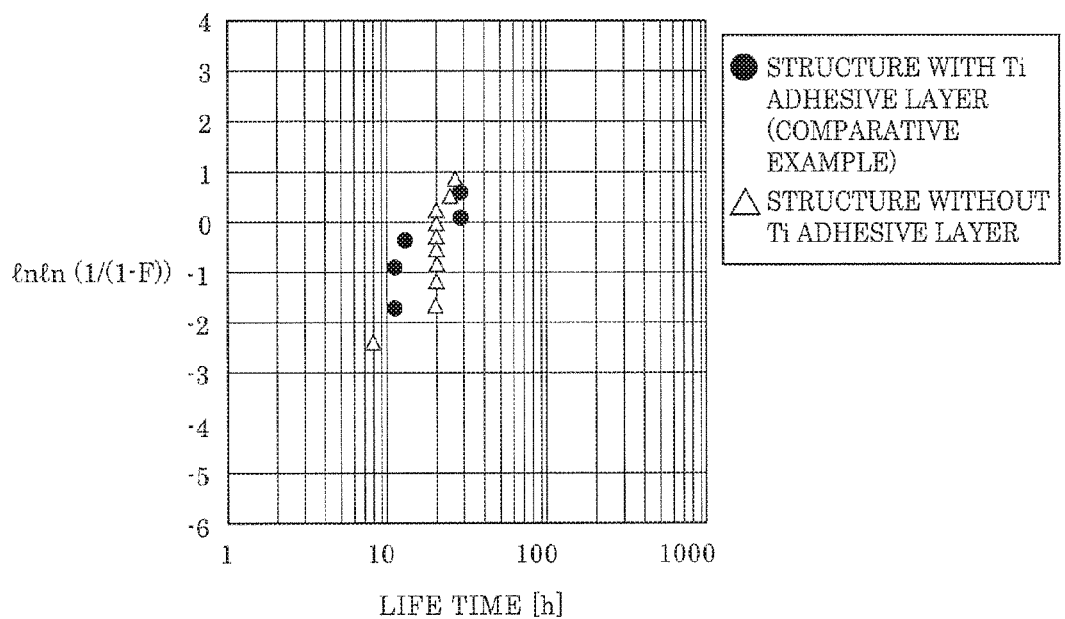
FIG. 14 shows the results of examination of the moisture resistance of the semiconductor device according to the related art.

The semiconductor devices described in Embodiments 1 to 6 will be compared to a semiconductor device having a configuration similar to a semiconductor device according to the related art. FIG. 12 is a schematic view illustrating the structure of a comparative semiconductor device similar to that of the related art; (a) is a sectional view of the semiconductor device, and (b) is a plan view thereof. In (b) of FIG. 12, second protective film 1305 is not illustrated. FIG. 13 is a Weibull plot of the semiconductor device according to Embodiment 1, and FIG. 14 is a Weibull plot of the comparative semiconductor device according to the related art.

As illustrated in FIG. 12, comparative electrode pad 1300 similar to an electrode pad according to the related art includes substrate 1301, semiconductor layer 1302, first protective film 1303, electrode pad 1304, second protective layer 1305, and adhesive layer 1306. Second protective layer 1305 has opening 1307.

Second protective layer 1305 is formed of SiN. Electrode pad 1304 is formed of Au. Adhesive layer 1306 including Ti is disposed between opening 1307 and electrode pad 1304.

The semiconductor device according to the related art, semiconductor device 1300 described above, the semiconductor devices according to Embodiments 1 to 6 were tested to examine the moisture resistance. The moisture resistance was examined by a highly accelerated temperature and humidity stress test (HAST), which was performed under a voltage of 480 V applied to the electrode pad and an environment at Ta of 130° C. and RH of 85%. The results are shown in FIGS. 13 and 14.

In comparison of the moisture-resistant lifetime of the semiconductor device, the results in FIGS. 13 and 14 show that the semiconductor devices according to Embodiments 1 to 5 have significantly prolonged lifetimes compared to the semiconductor devices similar to those in the related art including a conventional semiconductor device.

In other words, as illustrated in FIG. 13, the semiconductor devices according to Embodiments 1 to 5 have a lifetime of about 60 to 140 hours. The semiconductor device according to Embodiment 6 has a lifetime of about 150 hours.

In contrast, the semiconductor devices according to the related art have a lifetime of about 8 to 30 hours as shown in FIGS. 13 and 14. As shown in FIG. 14, the semiconductor device having a configuration similar to that of the related art has a lifetime of about 10 to 30 hours.

Semiconductor device 1300 having a configuration similar to that of the related art exhibited no difference in moisture-resistant lifetime caused by the presence/absence of adhesive layer 1306 including Ti. Accordingly, it was difficult to prevent invasion of water and improve the moisture resistance even if the end of the opening of the protective film including SiN was covered with an adhesive layer including Ti. In contrast, the results show that the semiconductor devices according to Embodiments 1 to 6 have prolonged lifetimes and improved moisture resistance.

The following mechanism is inferred: in semiconductor device 1300 having a configuration similar to that of the related art, electrode pad 1304 including Au has a film thickness of about 5 μ.

In contrast, in the semiconductor devices according to Embodiments 1 to 6, the first adhesive layer, the second adhesive layer, or the third adhesive layer disposed in the semiconductor device provides good adhesion between the components, significantly improving the moisture resistance of the semiconductor device. Furthermore, the semiconductor device according to Embodiment 6 having an electrode pad and a finger wiring structure has more prolonged moisture-resistant lifetime.

As described above, the semiconductor devices according to Embodiments 1 to 6 provide a solution to short moisture-resistant lifetime of conventional semiconductor devices, can prevent invasion of water into electrode pads and wiring layers, and ensure high moisture resistance of power transistors.

The semiconductor devices according to embodiments of this disclosure have been described, but this disclosure will not be limited to these embodiments.

For example, in the semiconductor devices according to the embodiments above, the adhesive layer (first adhesive layer, second adhesive layer, third adhesive layer) may have any other shape than those described above. The adhesive layer may include any one of $SiO_2$, $Si_3N_4$, AlN, $Al_2O_3$, $Ga_2O_8$, MgO, $ZrO_2$, $HfO_2$, and $La_2O_3$ listed above or a combination thereof. Any material other than these materials may be used.

The electrode pad may include Au, Al, or Cu, a combination thereof, or any material other than Au, Al, and Cu.

Moreover, other embodiments implemented with a combination of any components included in the semiconductor devices according to the embodiments above, a variety of modifications of the embodiments devised by those skilled in the art without departing the gist of the present disclosure, and a variety of devices including the semiconductor device according to the present disclosure are included in the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The semiconductor devices according to the present disclosure are useful as power transistors used in inverters, power conditioners, and power supply circuits.

What is claimed is:

1. A semiconductor device, comprising:
   a substrate;
   a semiconductor layer disposed on the substrate;
   a first protective film disposed on the semiconductor layer;
   a first adhesive layer disposed on the first protective film, and including at least one metal material selected from Ti, TiN, Ta, and TaN or a laminate including a combination of Ti, TiN, Ta, and TaN;
   an electrode pad disposed on the first protective film and in contact with side surfaces and part of an upper surface of the first adhesive layer;
   a second protective film disposed to cover and be in contact with the electrode pad and the first adhesive layer; and
   a first opening formed in part of the second protective film such that an upper surface of the electrode pad is exposed,
   wherein in a plan view, the first adhesive layer includes a first projection projecting from the electrode pad radially in a direction of a periphery of the electrode pad and continuously surrounding the electrode pad, and
   the second protective film is continuously disposed to cover and be in contact with part of the upper surface and part of side surfaces of the electrode pad, an upper surface and side surfaces of the first projection, and the first protective film.

2. The semiconductor device according to claim 1, further comprising
   a second adhesive layer disposed on the first protective film, and including at least one metal material selected from Ti, TiN, Ta, and TaN or a laminate including a combination of Ti, TiN, Ta, and TaN,
   wherein in the plan view, the second adhesive layer is disposed away from the electrode pad with a space, and continuously surrounds the electrode pad, and
   the second protective film is continuously disposed to cover and be in contact with part of the upper surface and part of the side surfaces of the electrode pad, the upper surface and the side surfaces of the first projection, the first protective film, and an upper surface and side surfaces of the second adhesive layer.

3. The semiconductor device according to claim 1, wherein a second adhesive layer is disposed on the first adhesive layer.

4. The semiconductor device according to claim 1, wherein the first adhesive layer penetrates through the first protective film from a side of the electrode pad, and is disposed in contact with the semiconductor layer.

5. The semiconductor device according to claim 1, further comprising:
   an ohmic electrode disposed on the semiconductor layer, the first protective film being disposed to cover an upper surface and side surfaces of the ohmic electrode;
   a second opening formed in part of the first protective film such that the upper surface of the ohmic electrode is exposed;
   a second adhesive layer disposed in contact with side surfaces of the second opening and part of an upper surface of the first protective film, and including at least one metal material selected from Ti, TiN, Ta, and TaN or a laminate including a combination of Ti, TiN, Ta, and TaN; and
   a first finger wiring layer disposed on the second adhesive layer, the second protective film being disposed to cover and be in contact with the first finger wiring layer and the second adhesive layer,
   wherein in a plan view, the second adhesive layer includes a second projection projecting from the first finger wiring layer radially in a direction of a periphery of the first finger wiring layer, and is in contact with the first adhesive layer across the width of the first finger wiring layer, and
   the second protective film is continuously disposed to cover and be in contact with an upper surface and side surfaces of the first finger wiring layer, an upper surface and side surface of the second projection, and the first protective film.

6. The semiconductor device according to claim 5, further comprising:
   a first p-type layer or first n-type layer disposed on the semiconductor layer and under the first protective film and continuously surrounding a portion immediately under side surfaces of the first adhesive layer; and
   a second p-type layer or a second n-type layer disposed on the semiconductor layer and under the first protective film and continuously surrounding a portion immediately under side surfaces of the second adhesive layer.

7. A semiconductor device, comprising:
   a substrate;
   a semiconductor layer disposed on the substrate;
   a first protective film disposed on the semiconductor layer;
   a first adhesive layer disposed on the first protective film, and including at least one metal material selected from Ti, TiN, Ta, and TaN or a laminate including a combination of Ti, TiN, Ta, and TaN;
   an electrode pad disposed on part of an upper surface of the first adhesive layer;
   a second protective film disposed to cover and be in contact with the electrode pad and the first adhesive layer; and a first opening formed in part of the second protective film such that an upper surface of the electrode pad is exposed, wherein in a plan view, the first adhesive layer includes a first projection projecting from the electrode pad radially in a direction of a periphery of the electrode pad, and the second protective film is continuously disposed to cover and be in contact with part of an upper surface and side surfaces of the electrode pad, an upper surface and side surfaces of the first projection, and the first protective film.

8. The semiconductor device according to claim 7, wherein a second adhesive layer is disposed on the first adhesive layer.

9. The semiconductor device according to claim 7, wherein the first adhesive layer penetrates through the first protective film from a side of the electrode pad disposed, and is in contact with the semiconductor layer.

10. The semiconductor device according to claim 7, further comprising:
   an ohmic electrode disposed on the semiconductor layer, the first protective film being disposed to cover an upper surface and side surfaces of the ohmic electrode;
   a second opening formed in part of the first protective film such that the upper surface of the ohmic electrode is exposed;
   a second adhesive layer disposed in contact with side surfaces of the second opening and part of an upper surface of the first protective film, and including at least one metal material selected from Ti, TiN, Ta, and TaN or a laminate including a combination of Ti, TiN, Ta, and TaN; and
   a first finger wiring layer disposed on the second adhesive layer, the second protective film being disposed to cover and be in contact with the first finger wiring layer and the second adhesive layer,
   wherein in a plan view, the second adhesive layer includes a second projection projecting from the first finger wiring layer radially in a direction of a periphery of the first finger wiring layer, and is in contact with the first adhesive layer across a width of the first finger wiring layer, and
   the second protective film is continuously disposed to cover and be in contact with an upper surface and side surfaces of the first finger wiring layer, an upper surface and side surfaces of the second projection, and the first protective film.

11. The semiconductor device according to claim 7, further comprising:
   an ohmic electrode disposed on the semiconductor layer, the first protective film being disposed to cover an upper surface and side surfaces of the ohmic electrode;
   a second opening formed in part of the first protective film such that the upper surface of the ohmic electrode is exposed;
   a second adhesive layer disposed in contact with side surfaces of the second opening and part of an upper surface of the first protective film, and including at least one metal material selected from Ti, TiN, Ta, and TaN or a laminate including a combination of Ti, TiN, Ta, and TaN; and
   a first finger wiring layer disposed on the second adhesive layer, the second protective film being disposed to cover and be in contact with the first finger wiring layer and the second adhesive layer,
   wherein in a plan view, the second adhesive layer includes a second projection projecting from the first finger wiring layer radially in a direction of a periphery of the first finger wiring layer, and a contact portion in contact with the first adhesive layer across of a width of the first finger wiring layer,
   a lower portion of the contact portion includes a second finger wiring layer in contact with the first adhesive layer and the second adhesive layer,
   in a length direction of the first finger wiring layer, the second protective film is continuously disposed to cover and be in contact with an upper surface and side surfaces of the first finger wiring layer, an upper surface of the second projection on the second finger wiring layer, an upper surface of the first projection on the second finger wiring layer, and part of side surfaces and part of an upper surface of the electrode pad, and
   in a width direction of the first finger wiring layer, the second protective film is continuously disposed to cover and be in contact with the upper surface and the side surfaces of the first finger wiring layer, the upper surface and the side surfaces of the second projection, and the first protective film.

12. The semiconductor device according to claim 10, further comprising:
   a first p-type layer or a first n-type layer disposed on the semiconductor layer and under the first protective film so as to continuously surround a portion immediately under side surfaces of the first adhesive layer; and
   a second p-type layer or a second n-type layer disposed on the semiconductor layer and under the first protective film so as to continuously surround a portion immediately under side surfaces of the second adhesive layer.

13. A semiconductor device, comprising:
   a substrate;
   a semiconductor layer disposed on the substrate;
   a first protective film disposed on the semiconductor layer;
   a first adhesive layer disposed on the first protective film, and including at least one metal material selected from Ti, TiN, Ta, and TaN or a laminate including a combination of Ti, TiN, Ta, and TaN;
   an electrode pad disposed away from the first adhesive layer with a space;
   a second protective film disposed to cover and be in contact with the electrode pad and the first adhesive layer;
   a first opening formed in part of the second protective film such that an upper surface of the electrode pad is exposed;
   an ohmic electrode disposed on the semiconductor layer, the first protective film being disposed on an upper surface and side surfaces of the ohmic electrode;
   a second opening formed in part of the first protective film such that an upper surface of the ohmic electrode is exposed;
   a second adhesive layer disposed side surfaces of the second opening and part of an upper surface of the first protective film, and including at least one metal material selected from Ti, TiN, Ta, and TaN or a laminate including a combination of Ti, TiN, Ta, and TaN; and
   a first finger wiring layer disposed on the second adhesive layer, the second protective film being disposed to cover and be in contact with the first finger wiring layer and the second adhesive layer, wherein:

in a plan view, the first adhesive layer is disposed away from the electrode pad with the space, and continuously surrounds the electrode pad, the second protective film is continuously disposed to cover and be in contact with part of an upper surface and side surfaces of the electrode pad, the first protective film, and an upper surface and side surfaces of the first adhesive layer, in a plan view, the second adhesive layer includes a first projection projecting from the first finger wiring layer radially in a direction of a periphery of the first finger wiring layer, and is in contact with the first adhesive layer across a width of the first finger wiring layer, and the second protective film is continuously disposed to cover and be in contact with an upper surface and side surfaces of the first finger wiring layer, an upper surface and side surfaces of the first projection, and the first protective film.

14. The semiconductor device according to claim 2, further comprising:

an ohmic electrode disposed on the semiconductor layer, the first protective film being disposed to cover an upper surface and side surfaces of the ohmic electrode;

a second opening formed in part of the first protective film such that an upper surface of the ohmic electrode is exposed;

a third adhesive layer disposed in contact with side surfaces of the second opening and part of an upper surface of the first protective film, and including at least one metal material selected from Ti, TiN, Ta, and TaN or a laminate including a combination of Ti, TiN, Ta, and TaN; and a first finger wiring layer disposed on the third adhesive layer, the second protective film being disposed to cover and be in contact with the first finger wiring layer and the third adhesive layer, wherein in a plan view, the third adhesive layer includes a second projection projecting from the first finger wiring layer to radially in a direction of periphery of the first finger wiring layer, and is in contact with the first adhesive layer and the second adhesive layer across a width of the first finger wiring layer, and the second protective film is continuously disposed to cover and be in contact with an upper surface and side surfaces of the first finger wiring layer, an upper surface and side surfaces of the second projection, and the first protective film.

15. The semiconductor device according to claim 14, further comprising:

a first p-type layer or a first n-type layer disposed on the semiconductor layer and under the first protective film so as to continuously surround a portion immediately under side surfaces of the second adhesive layer, and a second p-type layer or a second n-type layer disposed on the semiconductor layer and under the first protective film so as to continuously surround a portion immediately under side surfaces of the third adhesive layer.

* * * * *